(12) United States Patent
Iwasawa et al.

(10) Patent No.: US 8,080,463 B2
(45) Date of Patent: Dec. 20, 2011

(54) SEMICONDUCTOR DEVICE MANUFACTURING METHOD AND SILICON OXIDE FILM FORMING METHOD

(75) Inventors: Kazuaki Iwasawa, Yokohama (JP); Takeshi Hoshi, Yokohama (JP); Keisuke Nakazawa, Yokohama (JP); Shogo Matsuo, Yokohama (JP); Takashi Nakao, Yokohama (JP); Ryu Kato, Yokohama (JP); Tetsuya Kai, Yokohama (JP); Katsuyuki Sekine, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/691,483

(22) Filed: Jan. 21, 2010

(65) Prior Publication Data

US 2010/0190317 A1     Jul. 29, 2010

(30) Foreign Application Priority Data

Jan. 23, 2009 (JP) .................. 2009-012736
Mar. 27, 2009 (JP) .................. 2009-078525

(51) Int. Cl.
*H01L 21/76* (2006.01)
(52) U.S. Cl. ............... 438/423; 438/424; 257/E21.546; 257/E21.547
(58) Field of Classification Search .................. 438/423, 438/424; 257/E21.546, E21.547
See application file for complete search history.

(56) References Cited

U.S. PATENT DOCUMENTS

| | | | |
|---|---|---|---|
| 7,047,154 B2 | 5/2006 | Nagano | |
| 7,071,107 B2 | 7/2006 | Hieda et al. | |
| 7,238,587 B2 * | 7/2007 | Hoshi et al. | 438/424 |
| 7,407,864 B2 | 8/2008 | Kawasaki et al. | |
| 7,538,047 B2 | 5/2009 | Kawasaki et al. | |
| 7,582,572 B2 | 9/2009 | Iwasawa | |
| 7,598,151 B2 | 10/2009 | Hoshi et al. | |
| 2006/0246684 A1 | 11/2006 | Hoshi et al. | |
| 2007/0212894 A1 | 9/2007 | Nakazawa | |
| 2007/0284649 A1 | 12/2007 | Iwasawa | |
| 2009/0036629 A1 | 2/2009 | Kawasaki et al. | |
| 2009/0226615 A1 | 9/2009 | Nakazawa | |

FOREIGN PATENT DOCUMENTS

| | | |
|---|---|---|
| JP | 8-125021 | 5/1996 |
| JP | 2000-114362 | 4/2000 |
| JP | 2002-367980 | 12/2002 |
| JP | 2003-31650 | 1/2003 |
| JP | 2004-179614 | 6/2004 |
| JP | 2005-45230 | 2/2005 |
| JP | 2007-110005 | 4/2007 |
| JP | 2007-142155 | 6/2007 |
| JP | 2008-163596 | 7/2008 |
| JP | 2008-288263 | 11/2008 |

* cited by examiner

*Primary Examiner* — Charles Garber
*Assistant Examiner* — Abdulfattah Mustapha
(74) *Attorney, Agent, or Firm* — Finnegan, Henderson, Farabow, Garrett & Dunner, L.L.P.

(57) ABSTRACT

A semiconductor device manufacturing method has forming element isolation trenches in a semiconductor substrate, forming a silicon compound film in insides of the element isolation trenches in order to embed the element isolation trenches, conducting a first oxidation processing at a first temperature to reform a surface of the silicon compound film to a volatile matter emission preventing layer which permits passage of an oxidizing agent and impurities and which does not permit passage of a volatile matter containing silicon atoms, and conducting a second oxidation processing at a second temperature which is higher than the first temperature to form a coated silicon oxide film inside the element isolation trenches.

15 Claims, 19 Drawing Sheets

SEMICONDUCTOR DEVICE MANUFACTURING METHOD AND SILICON OXIDE FILM FORMING METHOD

CROSS-REFERENCE TO RELATED APPLICATION

This application is based upon and claims the benefit of priority from the prior Japanese Patent Application No. 2009-12736, filed on Jan. 23, 2009, and No. 2009-78525, filed on Mar. 27, 2009, the entire contents of which are incorporated herein by reference.

BACKGROUND OF THE INVENTION

1. Field of the Invention

The present invention relates to a method for forming a silicon oxide film in a semiconductor device manufacturing process, and a semiconductor device manufacturing method.

2. Background Art

In the semiconductor device development, it is demanded to improve the speed, reduce the power dissipation, and suppress the manufacturing cost. For satisfying these requirements, it is necessary to shrink the size of the semiconductor device and shrink the area of the semiconductor device. As one of effective means for it, it is mentioned to shrink the size of an element isolation region provided to isolate semiconductor elements included in the semiconductor device.

In recent years, the shallow trench isolation (STI) technique has been adopted as the method for manufacturing a minute element isolation region. According to the shallow trench isolation (STI) technique, an element isolation region is formed by embedding an insulation film of silicon oxide in a trench (element isolation trench) formed by using an anisotropic etching method such as the reactive ion etching (RIE).

As a method for forming the insulation film in the trench while suppressing generation of voids and seams, the spin on glass (SOG) method is known.

According to this method, an insulation film of silicon oxide is formed in the trench by coating a solution of a silicon compound (for example, polysilazane (polyperhydrosilazane) [—(SiH$_2$NH)n-]) serving as a material of silicon oxide by using the spin coating method and oxidizing the silicon compound. The silicon oxide film (insulation film) formed by using such a method is especially called coated silicon oxide film.

In general, the coated silicon oxide film formed by using such a method has the following issues.

(1) The film density is low.

(2) There are a large number of impurities in the film.

As a method for solving these issues, there is a method for oxidizing a silicon compound to form a coated silicon oxide film and then conducting anneal processing in an atmosphere of nitrogen or the like. The bond structure of the coated silicon oxide film can be made more minute by conducting the anneal processing (heating processing). At the same time, impurities which still remain in the coated silicon oxide film can be removed. As a result, the issues of the coated silicon oxide film can be solved.

In the process for forming the coated silicon oxide film by conducting the above-described processing, however, the coated silicon oxide film contracts and film stress is generated, resulting in new issues such as occurrence of defects in the coated silicon oxide film, peeling of the coated silicon oxide film, and deformation of the element isolation region.

As the method for solving such a new issue, therefore, the following proposals have been made.

According to a proposed method, all insulation films of silicon oxide in the trench are not formed by using the SOG method, but a coated silicon oxide film is first formed on the lower half in the trench by using the SOG method, and in addition an HTO (High Temperature Oxide) film (silicon oxide film) having a bond structure which is more minute than that of the coated silicon oxide film is embedded in the upper half in the trench which is equivalent to over the coated silicon oxide film (see, for example, Japanese Patent Laid-Open No. 2000-114362).

According to another proposed method, a coated silicon oxide film is formed in the lower half of the trench by using the SOG method, and in addition a silicon oxide film having a bond structure which is more minute than that of the coated silicon oxide film is embedded in the upper half in the trench which is equivalent to over the coated silicon oxide film by using the high density plasma chemical vapor deposition (HDP-CVD) method (see, for example, Japanese Patent Laid-Open No. 2003-31650).

However, both proposed methods need the CMP (Chemical Mechanical Polishing) process at least twice. In other words, a remarkable increase in the number of processes and complicated processes cause issues such as a lowered process margin.

According to another proposed method, a silicon oxide film having a bond structure which is more minute than that of a coated silicon oxide film is embedded in the lower half in the trench by using the HDP-CDV method, and in addition, a coated silicon oxide film is embedded in the upper half in the trench which is equivalent to over the silicon oxide film (see, for example, Japanese Patent Laid-Open No. 2003-31650).

In this method as well, however, the coated silicon oxide film is embedded in the upper half in the trench. In the coated silicon oxide film which occupies the upper half of the trench, therefore, peeling of the coated silicon oxide film or ensuing wet etching poses a issue that an abnormality of the local shape is caused in the coated silicon oxide film.

As the insulation film embedding technique for STI and PMD (Pre Metal Dielectric) advanced in size shrinking, a plurality of techniques can be mentioned. For example, a technique for embedding a film having fluidity such as a SOG film and a TEOS (Tetraethyl Orthosilicate) film formed by using the spin coating method, and a technique for combining an HDP-CVD silicon oxide film and the above-described film having fluidity and embedding a resultant film are considered to become promising.

As one of its methods, there is a method for embedding a perhydrosilazane polymer (polysilazane) solution in an STI trench formed in a semiconductor substrate, oxidizing the semiconductor substrate in a steam atmosphere in a diffusion furnace or the like, and thereby forming a silicon oxide film in the STI trench (see, for example, see, for example, Japanese Patent Laid-Open No. 2004-179614 and Japanese Patent Laid-Open No. 2002-367980).

In the coated polysilazane film, nitrogen (N) contained in the raw material and carbon (C) contained in an organic solvent such as dibutyl ether remain in the film as impurities. For obtaining a silicon oxide film having a good film quality, therefore, it is necessary to increase the quantity of oxidation to remove these impurities.

For transforming the polysilazane film to a silicon oxide film having a good quality, annealing is conducted in an atmosphere of inert gas such as nitrogen to make the polysilazane film oxidized by, for example, steam oxidation.

At the time of this annealing, however, film contraction in the polysilazane film occurs. Stress is applied to the foundation (semiconductor substrate) by the film contraction, resulting in a cause of occurrence of crystal defects or the like in the semiconductor substrate.

SUMMARY OF THE INVENTION

According to one aspect of the present invention, there is provided: a semiconductor device manufacturing method comprising:

conducting a first oxidation processing to reform a surface of a silicon compound film; and conducting a second oxidation processing to form a coated silicon oxide film from the silicon compound film.

According to one aspect of the present invention, there is provided: a semiconductor device manufacturing method comprising:

forming element isolation trenches in a semiconductor substrate;

coating a silicon compound solution obtained by dissolving a silicon compound in a solvent to insides of the element isolation trenches to embed the element isolation trenches;

conducting a first oxidation processing at a first temperature to reform a surface of the silicon compound solution to a volatile matter emission preventing layer which permits passage of an oxidizing agent, impurities and the solvent and which does not permit passage of a volatile matter containing silicon atoms;

conducting heating processing to evaporate the solvent via the volatile matter emission preventing layer and form a silicon compound film from the silicon compound solution located under the volatile matter emission preventing layer; and conducting a second oxidation processing at a second temperature which is higher than the first temperature to form a coated silicon oxide film inside the element isolation trenches.

DETAILED DESCRIPTION

Figure 1:
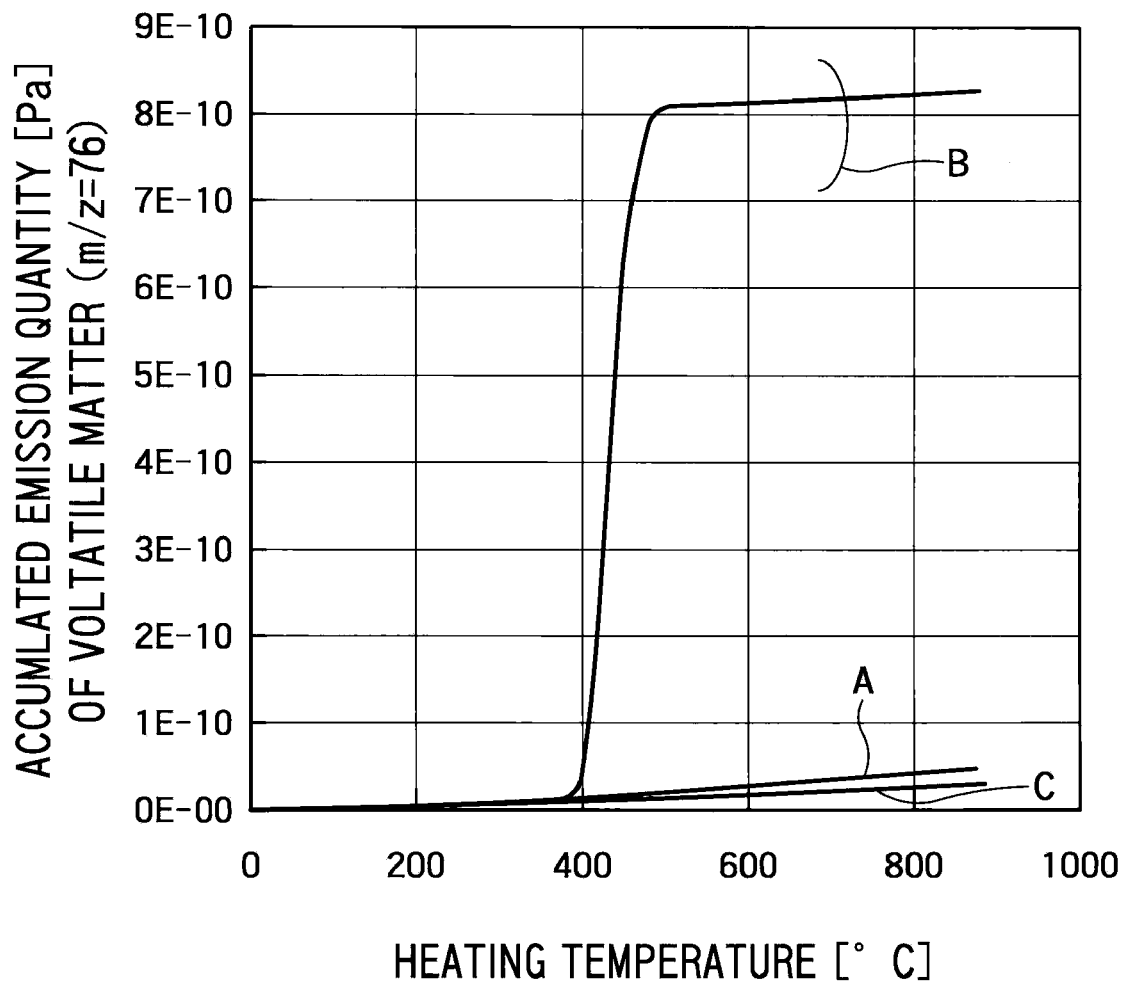
FIG. 1 is a graph showing relations between the thermal processing temperature and the emission accumulation quantities of the volatile matter having a molecular weight of 76 from the polysilazane film.

Hereafter, a semiconductor device manufacturing method and a silicon oxide film forming method according to the present invention will be described more specifically with reference to the drawings.

Prior to description of embodiments of the present invention, a method for forming an insulation film of coated silicon oxide used by the present inventors heretofore will be described briefly.

Herein, "silicon compound film" means a film containing silicon atoms which becomes the coated silicon oxide film by being oxidized.

The case where an insulation film composed of the coated silicon oxide is formed within a trench (element isolation trench) of a semiconductor device will now be described as an example.

A semiconductor film is formed on a semiconductor substrate, and a plurality of trenches is formed in a part of the semiconductor substrate and the semiconductor film. Then, a silicon compound coating solution (silicon compound solution) is made by dissolving a silicon compound (for example, polysilazane) which becomes a material of a silicon compound film in a solvent. The trench is embedded with this silicon compound coating solution. Pre-baking (heating processing) is conducted to evaporate the solvent contained in the silicon compound coating solution. In this way, a silicon compound film is within each of a plurality of trenches. Then, high temperature oxidation processing is conducted in an atmosphere such as steam. By doing so, the silicon compound film is oxidized and the coated silicon oxide film is formed in each of the trenches. In addition, anneal processing (heating processing) is conducted in order to make the bond structure of the coated silicon oxide film more minute.

Heretofore, the present inventors have formed the coated silicon oxide film in the trenches by using the method heretofore described.

For further improving the performance and the reliability of the semiconductor device, however, it is necessary to decrease defects of the coated silicon oxide film in the trenches of the semiconductor device.

It is considered that film contraction or film stress is caused by high temperature oxidation processing or heating processing at the time when oxidizing the silicon compound film and forming the coated silicon oxide film and thereby defects are generated in the coated silicon oxide film.

First, the present inventors have individually conducted an analysis about a cause of contraction of the coated silicon oxide film at the time of the high temperature oxidation processing for oxidizing the silicon compound film to form the coated silicon oxide film.

The present inventors have conducted experiments to know what kind of phenomenon is occurring in the silicon compound film at the time of the high temperature oxidation processing. In other words, the present inventors have measured the thermal desorption spectroscopy (TDS) in order to know relations among a molecular weight of a volatile matter emitted from the silicon compound film during the high temperature oxidation processing, its emitted quantity, and the temperature of the high temperature oxidation processing.

Hereafter, details thereof will be described.

A polysilazane film is formed as a silicon compound film according to the method described earlier by using polysilazane as the silicon compound and using dibutyl ether as the solvent for dissolving polysilazane. Then, the polysilazane film is heated while raising the temperature under the existence of an oxidizing agent. The molecular weight of the volatile matter emitted from the polysilazane film and the pressure of the volatile matter for each molecular weight are measured. The pressure of the volatile matter is proportionate to the accumulation quantity emitted from the volatile matter.

Results of the measurement are shown in FIG. 1. FIG. 1 is a graph showing relations between the thermal processing temperature and the emission accumulation quantities of the volatile matter having a molecular weight of 76 from the polysilazane film.

A curve B in FIG. 1 indicates the pressure of the volatile matter having the molecular weight of 76 emitted from the polysilazane film, i.e., emission accumulation quantity as a function of the temperature of the oxidation processing (a curve A in FIG. 1 will be described later). A curve C in FIG. 1 indicates the background.

As appreciated from the curve B in FIG. 1, the volatile matter having the molecular weight of 76 is little emitted from the polysilazane film when the oxidation processing temperature is 300° C. or less. However, it is appreciated that the emission quantity of the volatile matter having the molecular weight of 76 abruptly increases if the temperature of the oxidation processing exceeds 300° C.

It is conjectured based on various elements and the molecule structure contained in the polysilazane film and the solvent (dibutyl ether) considered to remain slightly in the polysilazane film that the volatile matter having the molecular weight of 76 is $SiO_3$, $SiC_4$ and $CH_4O_2Si$. In other words, it is conjectured that when the temperature of the oxidation processing exceeds 300° C. a matter having a low molecular weight containing silicon atoms is volatilizing from the polysilazane film.

Based on such results obtained from the measurement, the present inventors consider the reason why the coated silicon oxide contracts as hereafter described.

In other words, the silicon compound film (polysilazane film) is oxidized, under the presence of an oxidizing agent, by being subjected to the high temperature oxidation processing at a high temperature, for example, at 300° C. or more to become the coated silicon oxide film. At the time of such high temperature oxidation processing, a volatile matter having a low molecular weight containing silicon atoms which constitute the silicon compound film escapes and is emitted. The coated silicon oxide film during the oxidation processing has a bond structure having flexibility. Therefore, the coated silicon oxide film causes film contraction so as to make up for a part from which silicon atoms have escaped.

Based on such an individual consideration, the present inventors have considered that the contraction of the coated silicon oxide film can be suppressed and consequently defects of the coated silicon oxide film can be decreased by preventing the volatile matter having the low molecular weight and containing silicon atoms from being emitted from the silicon compound film at the time of high temperature oxidation processing. The present inventors have considered that this can be attained by conducting the oxidation processing for oxidizing the silicon compound film at a low temperature, for example, at a temperature of 300° C. or less. Even if the surface of the silicon compound film can be oxidized, however, it is difficult to oxidize up to the inside of the silicon compound film in such oxidation processing at the low temperature.

Therefore, the present inventors have considered that if it is inevitable to use the method for oxidizing the silicon compound film at a high temperature a volatile matter emission preventing layer having the property of preventing passage of a volatile matter having a low molecular weight and containing silicon atoms should be formed on the silicon compound film before conducting the high temperature oxidation processing (second oxidation processing). Because owing to existence of such a volatile matter emission preventing layer on the silicon compound film, it is possible to prevent the volatile matter having the low molecular weight and containing silicon atoms from being emitted from the silicon compound film at the time of high temperature oxidation processing.

In addition, the present inventors have thought of providing the volatile matter emission preventing layer with not only the property of preventing the passage of the volatile matter having the low molecular weight and containing silicon atoms but also a property of passing an oxidizing agent such as oxygen, ozone, or water through it. Because owing to the property of passing the oxidizing agent through it, it becomes possible for the oxidizing agent to arrive at the silicon compound film located under the volatile matter emission preventing layer even after the volatile matter emission preventing layer is formed and consequently the silicon compound film can be oxidized.

Furthermore, the present inventors have thought of providing the volatile matter emission preventing layer with a property of passing hydrogen or nitrogen through it in addition to the properties described heretofore. Because owing to such a property of the volatile matter emission preventing layer it becomes possible to evaporate hydrogen, nitrogen or the like which are impurities in the coated silicon oxide film, from the silicon compound film and the coated silicon oxide film and remove these substances from the silicon compound film and the coated silicon oxide film.

Therefore, the present inventors have selected to form the volatile matter emission preventing layer with silicon oxide in order to provide the volatile matter emission preventing layer with all properties described above, based on various experiment results obtained until then and the molecular structure of the volatile matter having the low molecular weight and containing silicon atoms.

In addition, it is also possible to obtain advantages described below by forming the volatile matter emission preventing layer of silicon oxide.

In the case where the volatile matter emission preventing layer is formed of a substance other than silicon oxide, there is a possibility that molecules contained in the substance which constitutes the volatile matter emission preventing layer will become impurities and contaminate the insulation film (the silicon oxide film) in the trenches, even if the volatile matter emission preventing layer is provided with all properties described above. In addition, if such impurities enter the insulation film in the trenches and contaminate the insulation film, there is a possibility that defects will be caused in the insulation film.

On the other hand, if the volatile matter emission preventing layer is formed of silicon oxide, it is possible obtain an advantage that there is no fear of contaminating the insulation film because the same substance as that of the insulation film (the silicon oxide film) in the trenches.

Furthermore, since the volatile matter emission preventing layer is formed of silicon oxide, it is possible to use reforming of oxidizing the surface of the silicon compound film formed already in the trenches to obtain the volatile matter emission preventing layer. Since it is not necessary to purposely stack a separate silicon oxide film on the silicon compound film by doing so, it is possible to obtain an advantage that a remarkable increase of the number of processes for forming the coated silicon oxide film can be avoided.

However, adoption of this method causes the following new issue.

If reforming of forming the volatile matter emission preventing layer is conducted by using high temperature oxidation processing, which is the conventional oxidation method for the silicon compound film, then the volatile matter having the low molecular weight and containing silicon atoms is emitted, resulting in contraction of the silicon compound film. In addition, an issue that defects are caused in the silicon compound film by the contraction of the silicon compound film is posed.

Therefore, the present inventors have decided to form the volatile matter emission preventing layer by using reforming of oxidizing the surface of the silicon compound film (first oxidation processing) at a low temperature, for example, by using ozone oxidation processing at a low temperature. As a result, it becomes possible to modify the surface of the silicon compound film and form the volatile matter emission preventing layer while avoiding the emission of the volatile matter having the low molecular weight and containing silicon atoms.

In addition, silicon oxide is made to exist on the surface of the silicon compound film by forming the volatile matter emission preventing layer of silicon oxide. At the time of the oxidation processing after the volatile matter emission preventing layer is formed, oxidation of the silicon compound film is advanced by using silicon oxide existing on the surface of the silicon compound film as a base point. This results in an advantage that oxidation of the whole silicon compound film can be advanced efficiently.

Then, the present inventors have conducted experiments to determine whether emission of the volatile matter from the silicon compound film is prevented when the volatile matter emission preventing layer is formed. Results of the confirmation experiments will now be described with reference to FIG. 1.

FIG. 1 shows relations between the oxidation processing temperature and the emission accumulation quantities of the volatile matter having a molecular weight of 76 emitted from the polysilazane film (silicon compound film). A curve A in FIG. 1 shows the case where the volatile matter emission preventing layer is formed on the surface of the polysilazane film. On the other hand, a curve B in FIG. 1 shows the case where the volatile matter emission preventing layer is not formed on the surface of the polysilazane film. A curve C in FIG. 1 indicates the background.

As appreciated from FIG. 1, the quantity of the volatile matter having the molecular weight of 76 emitted from the polysilazane film having the volatile matter emission preventing layer abruptly increases if the temperature of the oxidation processing rises above 300° C. (see the curve B in FIG. 1). On the other hand, even if the temperature of the oxidation processing rises, the volatile matter having the molecular weight of 76 is little emitted from the polysilazane film having the volatile matter emission preventing layer (see the curve A in FIG. 1). In other words, it has been confirmed that emission of the volatile matter having the low molecular weight and containing silicon atoms is prevented by forming the volatile matter emission preventing layer on the surface of the polysilazane film.

In addition, it has been determined whether contraction of the coated silicon oxide film is suppressed by forming the volatile matter emission preventing layer of silicon oxide on the surface of the silicon compound film to prevent emission of the volatile matter.

Hereafter, details of the confirmation will be described.

The contraction of the coated silicon oxide film have been checked by measuring the film thickness of the polysilazane film (silicon compound film) and measuring the film thickness of the coated silicon oxide film obtained by then conducting high temperature oxidation processing and comparing them with each other. As an index indicating the contraction, a contraction factor obtained by finding the difference between the film thickness of the polysilazane film and the film thickness of the coated silicon oxide film obtained by then conducting high temperature oxidation processing and dividing the difference by the film thickness of the polysilazane film is used.

When films are fabricated under the same condition, the film on which the volatile matter emission preventing layer is not formed is 19% in contraction factor, whereas the film on which the volatile matter emission preventing layer is formed is limited to 10% in contraction factor. In other words, it has been appreciated from this result that the contraction of the coated silicon oxide film can be suppressed by forming the volatile matter emission preventing layer.

As heretofore described, it is revealed that there is an effect that emission of the volatile matter having the low molecular weight and containing silicon atoms is prevented and the contraction of the coated silicon oxide film is suppressed at the time of the high temperature oxidation processing by forming the volatile matter emission preventing layer of silicon oxide on the surface of the silicon compound film.

Even if the volatile matter emission preventing layer and the coated silicon oxide film are formed in this way, however, the film stress is still generated in the coated silicon oxide film.

Therefore, the present inventors have thought that it is necessary to suppress the occurrence of the film stress and consequently further decrease defects in the coated silicon oxide film in order to make the film quality of the coated silicon oxide film further better.

The present inventors have thought that the film stress in the coated silicon oxide film might be generated at the time of anneal processing (heating processing). Hereafter, details of the generation mechanism of the film stress in the coated silicon oxide film individually thought by the present inventors will be described.

First, it is considered that the following change occurs in the coated silicon oxide film at the time of the anneal processing.

Unoxidized parts sometimes exist in the coated silicon oxide film before the anneal processing. In addition, the coated silicon oxide film before the anneal processing dose not yet form a firm bond structure. The Unoxidized part is oxidized by conducting the anneal processing on such a coated silicon oxide film. At the same time, the coated silicon oxide film changes so as to form a minute and firm bond structure.

In other words, a part of silicon atoms in the bond structure of the coated silicon oxide film before the anneal processing remains bonded to hydrogen atoms or nitrogen atoms. In addition, in the bond structure in the coated silicon oxide film before the anneal processing, silicon atoms and oxygen atoms do not bond regularly. By conducting the anneal processing on such a coated silicon oxide film, hydrogen atoms and nitrogen atoms which have remained in the bond structure of the coated silicon oxide film escape and are replaced by oxygen atoms. At the same time, the coated silicon oxide film is changed so as to have a regular, minute, firm bond structure in which each silicon atom bonds to another silicon atom via an oxygen atom.

In other words, it is considered that the two changes described heretofore are simultaneously occurring in the coated silicon oxide film during the anneal processing.

The present inventors have considered that hydrogen atoms and nitrogen atoms which have remained in the coated silicon oxide film escape from the coated silicon oxide film, they are replaced by oxygen atoms, and a coated silicon oxide film having a minute and firm bond structure is formed, resulting in a strain in the bond structure. In addition, the present inventors have considered that the film stress might be caused by the strain in the bond structure.

Therefore, the present inventors have thought that hydrogen atoms and nitrogen atoms in the coated silicon oxide film should be removed and replaced by oxygen atoms while preventing the coated silicon oxide film from forming a minute firm bond structure before the coated silicon oxide forms a minute firm bond structure, for suppressing the occurrence of the film stress in the coated silicon oxide film. In other words, the present inventors have thought that it suffices to only oxidize the Unoxidized part in the coated silicon oxide film before conducting the anneal processing.

As for such a method, the present inventors have thought of conducting oxidation processing at a low temperature (third oxidation processing), for example, ozone oxidation at a low temperature. Because according to this method, the Unoxidized parts of the coated silicon oxide film can be oxidized without causing the coated silicon oxide film to have a minute firm bond structure.

The present inventors have conducted confirmation to determine whether generation of the film stress in the coated silicon oxide film is obstructed by conducting oxidation processing at a low temperature (the third oxidation processing) before the anneal processing. To be more precise, the present inventors have measured the film stress in the coated silicon oxide film by optically measuring the warp of the semiconductor substrate having the coated silicon oxide film formed thereon. Hereafter, results of the measurement will be described.

A coated silicon oxide film is formed according to the method described above. In other words, a polysilazane film (silicon compound film) is subject to high temperature oxidation processing at 500° C. for 5 minutes in a steam environment. Then, anneal processing is conducted at 850° C. for 30 minutes in a nitrogen environment to form a coated silicon oxide film. The coated silicon oxide film thus obtained has a film stress of 115 MPa.

On the other hand, a coated silicon oxide film is formed by using a similar method and further adding the ozone oxidation processing (the third oxidation processing) at a low temperature before the anneal processing. The coated silicon oxide film thus obtained has a film stress of 88 MPa.

In other words, it is appreciated that the film stress of the coated silicon oxide film finally obtained is decreased by adding the oxidation processing at a low temperature (the third oxidation processing).

From this result, therefore, it is confirmed that the generation of the film stress in the coated silicon oxide film is suppressed by adding the oxidation processing at a low temperature (the third oxidation processing) before the anneal processing.

The present invention has been made based on individual finding of the present inventors described heretofore.

Hereafter, embodiments of the present invention will be described by taking a method for manufacturing a NAND flash memory as an example. However, the present invention is not restricted to the manufacturing method for the NAND flash memory.

First Embodiment

Figure 2:
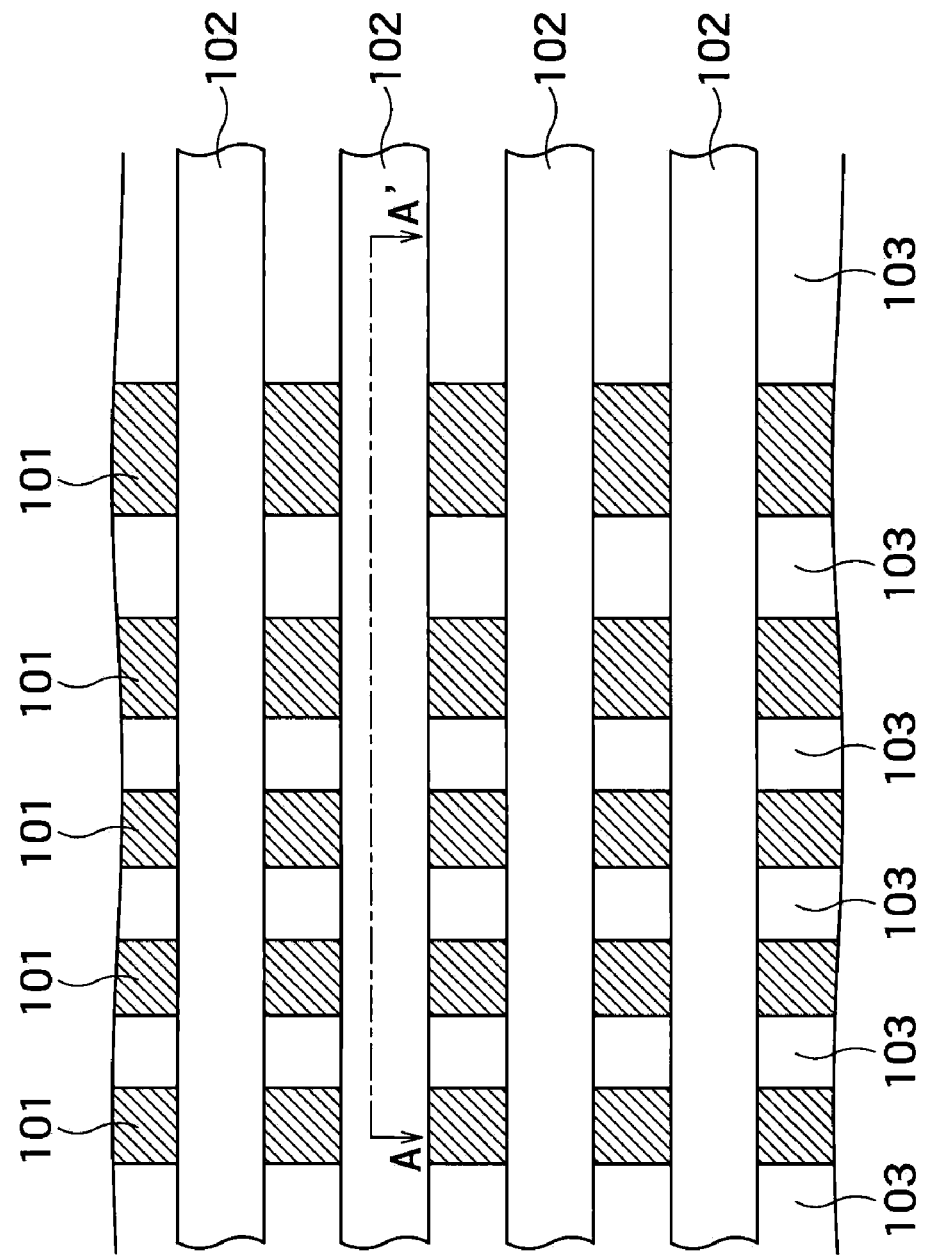
FIG. 2 is a schematic plan view (a part) of a semiconductor device according to a first embodiment of the present invention.
Figure 3:
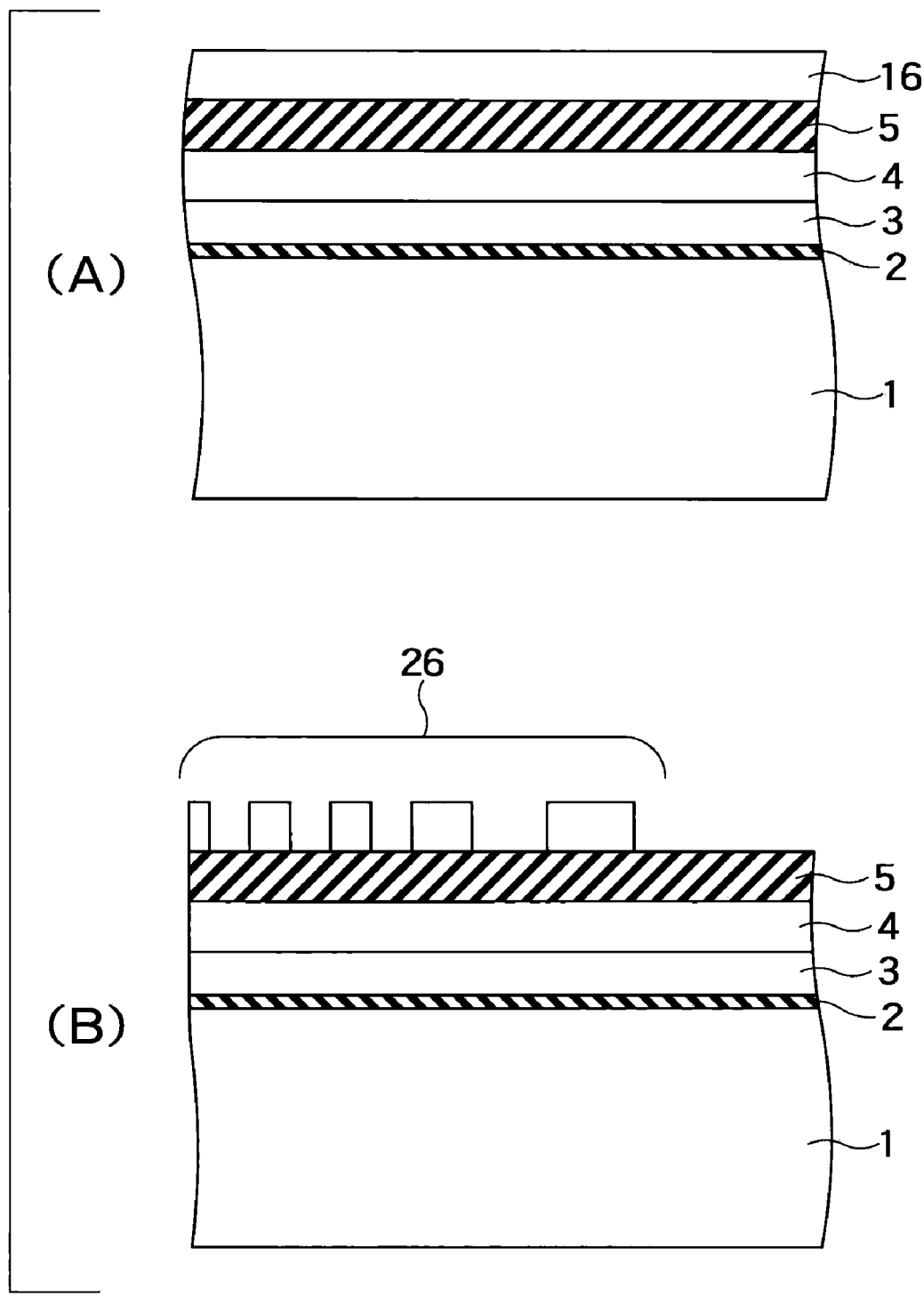
FIG. 3 is a schematic process sectional view showing a manufacturing method of the semiconductor device according to the first embodiment, the fourth embodiment and the fifth embodiment of the present invention.
Figure 4:
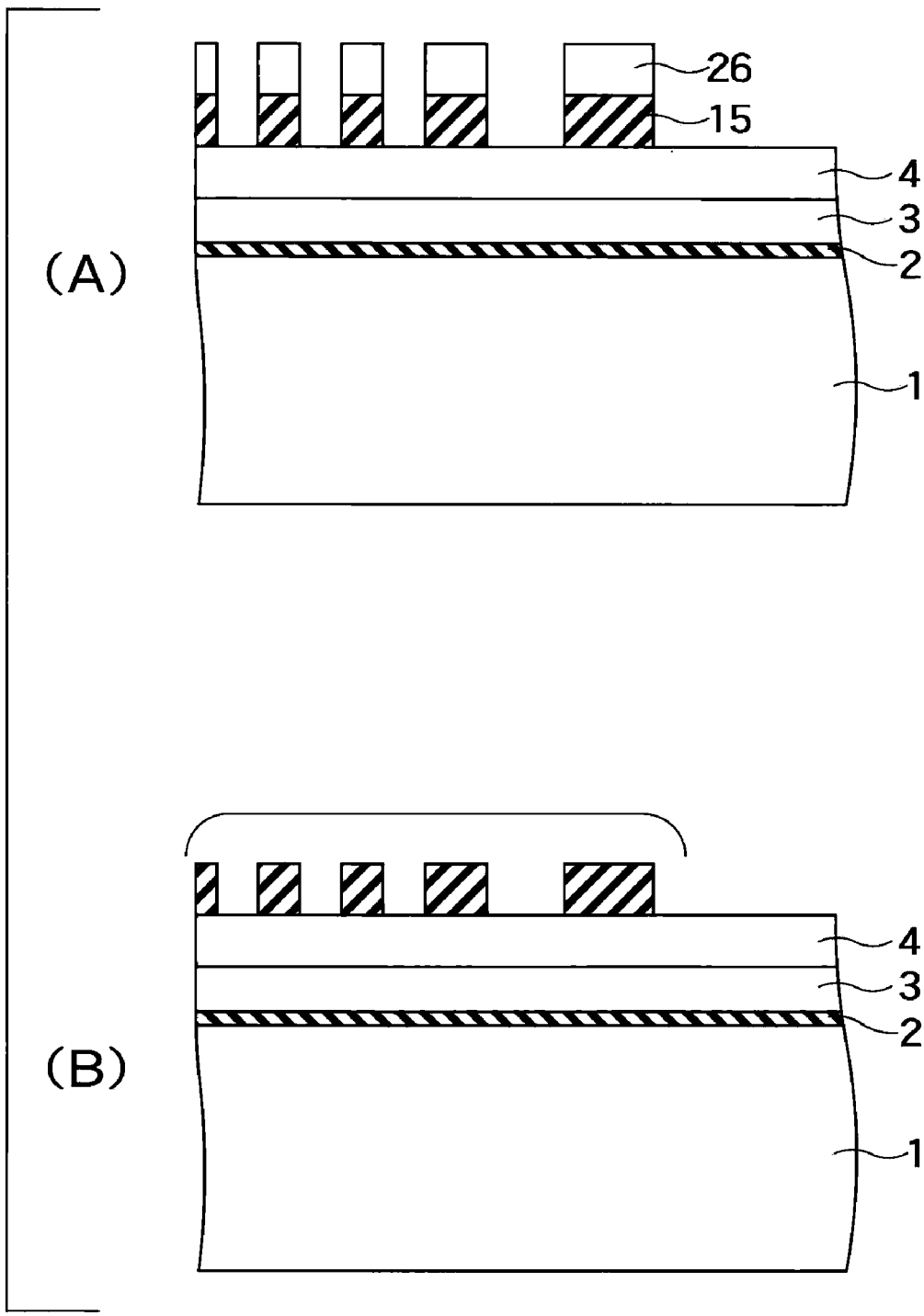
FIG. 4 is a schematic process sectional view showing a manufacturing method of the semiconductor device according to the first embodiment, the fourth embodiment and the fifth embodiment of the present invention, and is continuous from FIG. 3.
Figure 5:
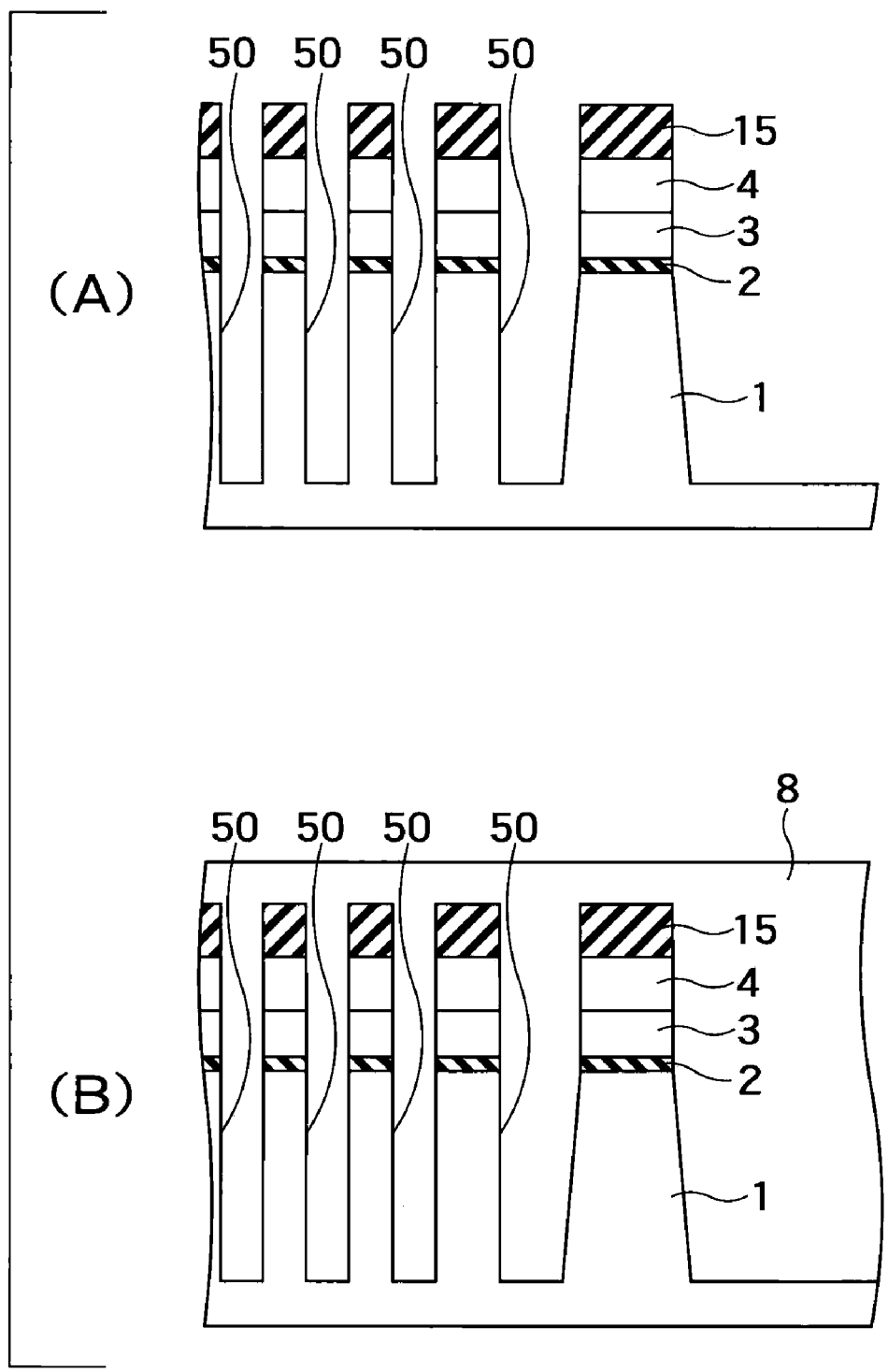
FIG. 5 is a schematic process sectional view showing a manufacturing method of the semiconductor device according to the first embodiment, the fourth embodiment and the fifth embodiment of the present invention, and is continuous from FIG. 4.
Figure 6:
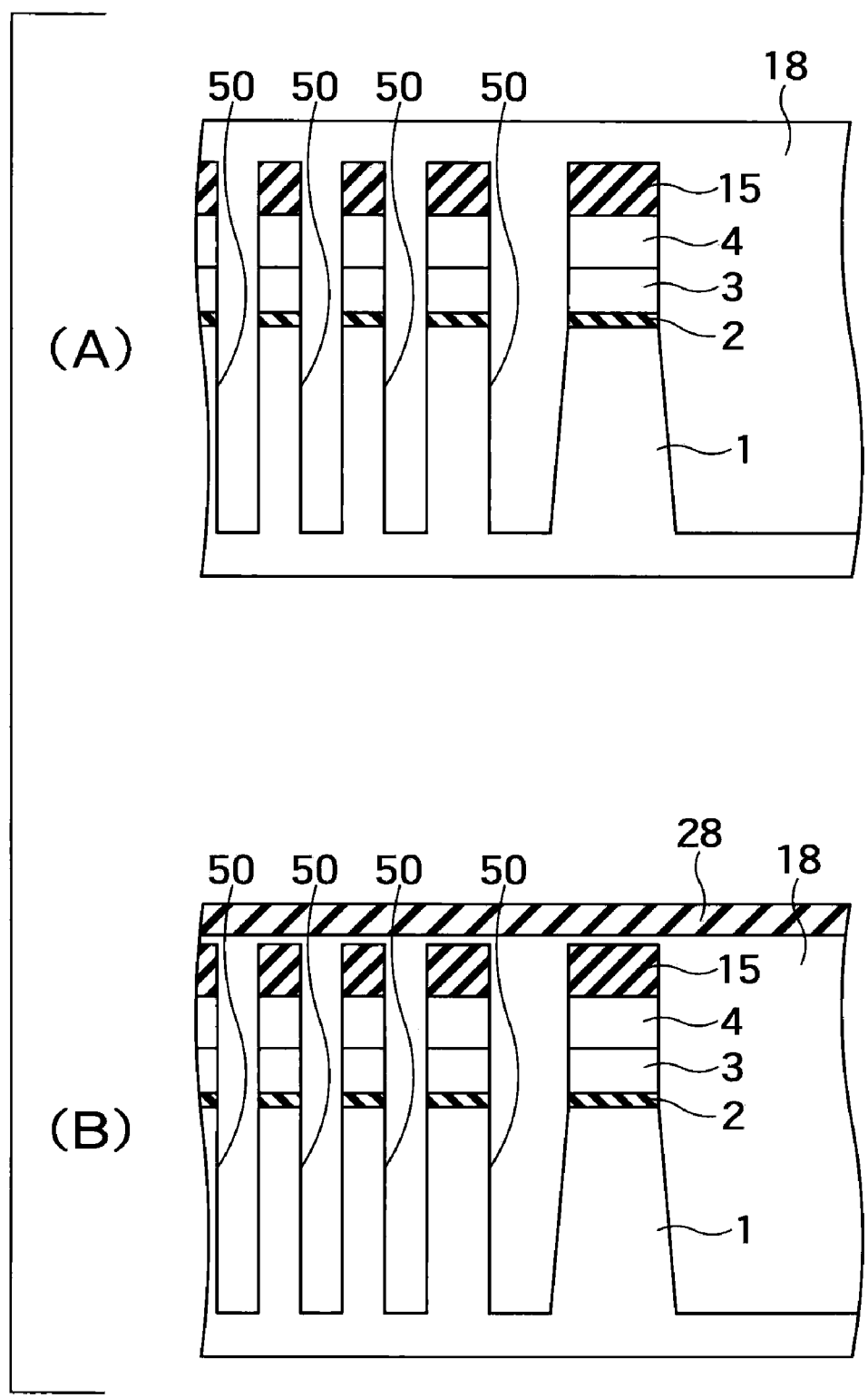
FIG. 6 is a schematic process sectional view showing a manufacturing method of the semiconductor device according to the first embodiment, the fourth embodiment and the fifth embodiment of the present invention, and is continuous from FIG. 5.
Figure 7:
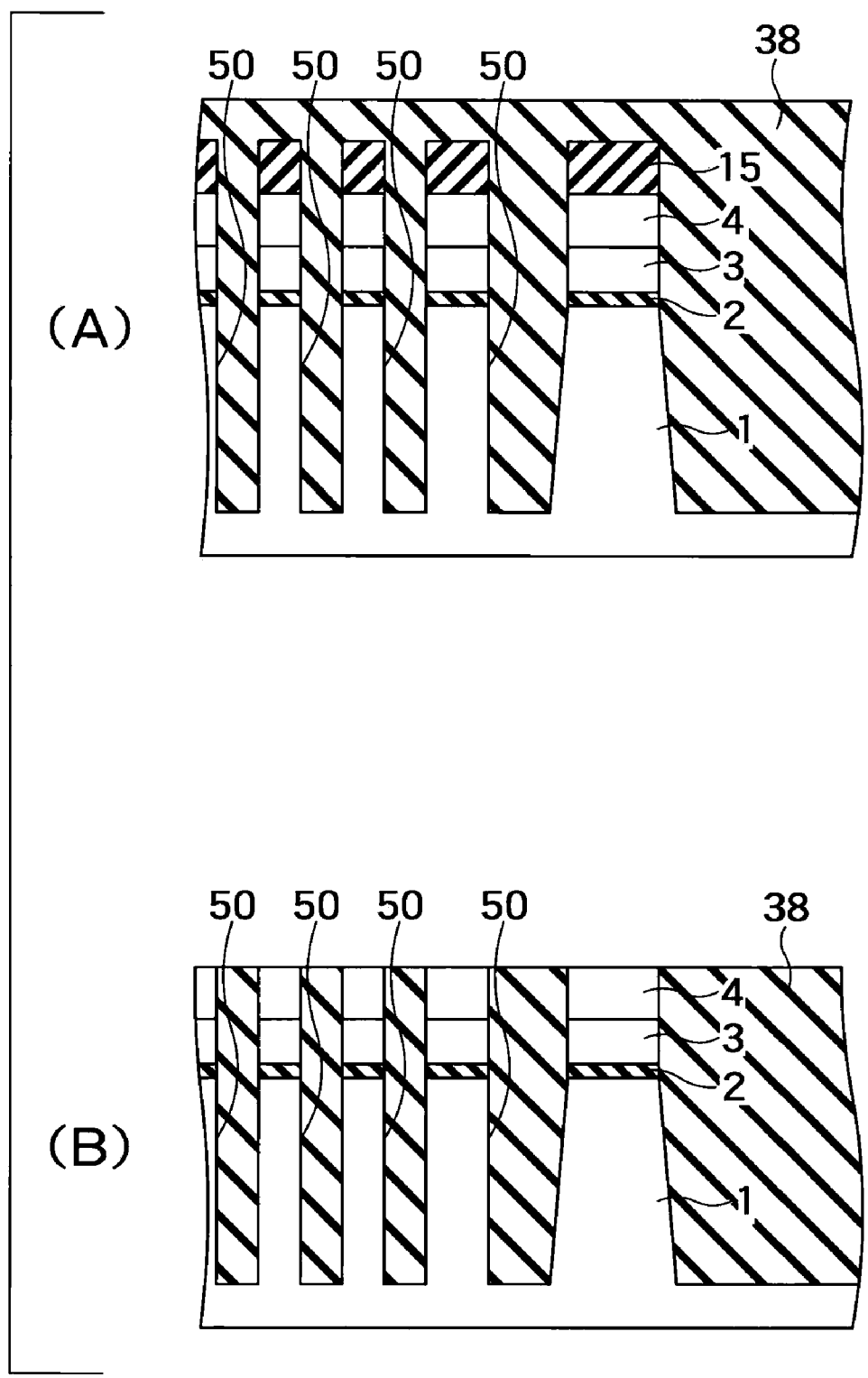
FIG. 7 is a schematic process sectional view showing a manufacturing method of the semiconductor device according to the first embodiment, the fourth embodiment and the fifth embodiment of the present invention, and is continuous from FIG. 6.
Figure 8:
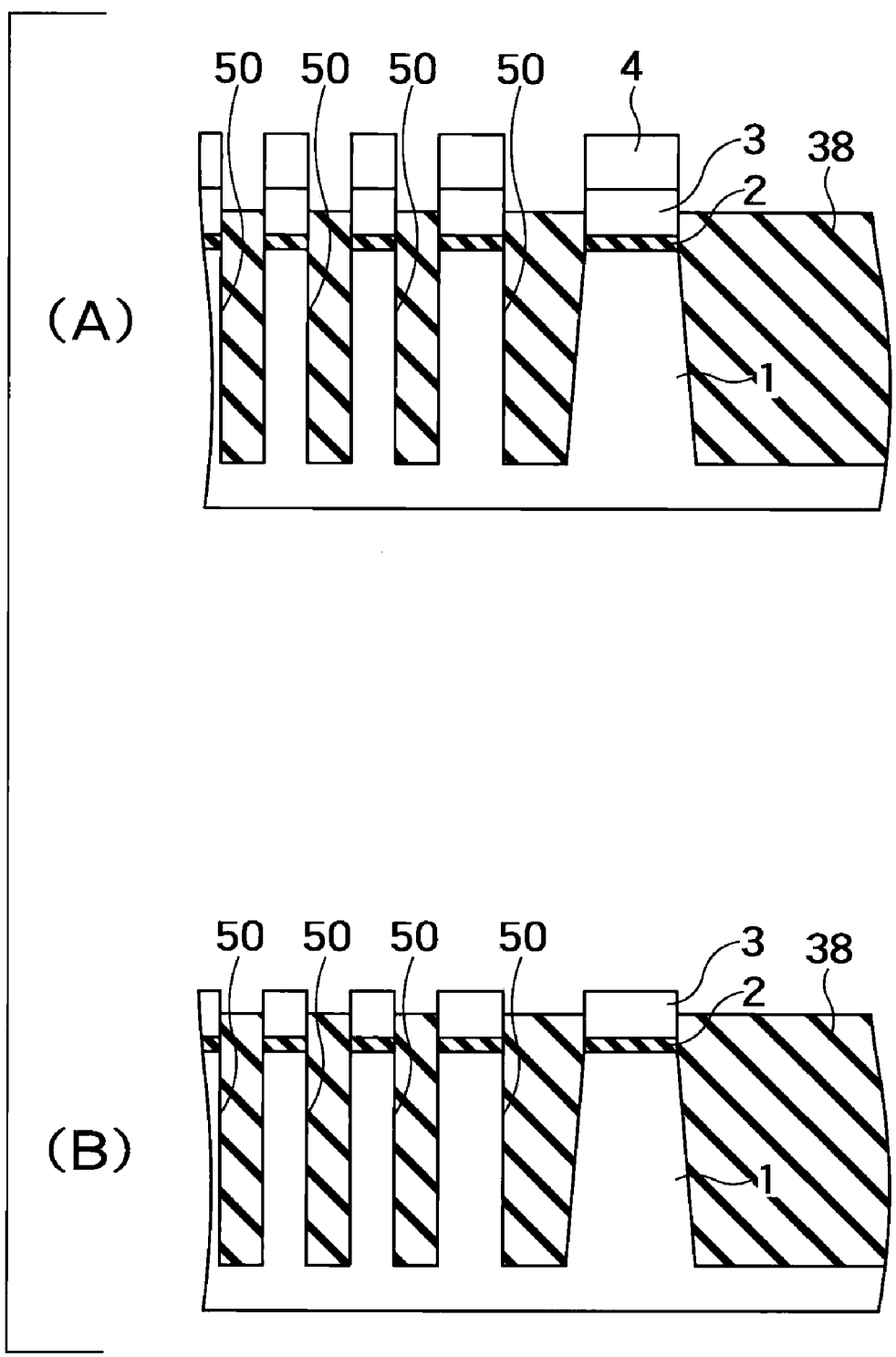
FIG. 8 is a schematic process sectional view showing a manufacturing method of the semiconductor device according to the first embodiment, the fourth embodiment and the fifth embodiment of the present invention, and is continuous from FIG. 7.
Figure 9:
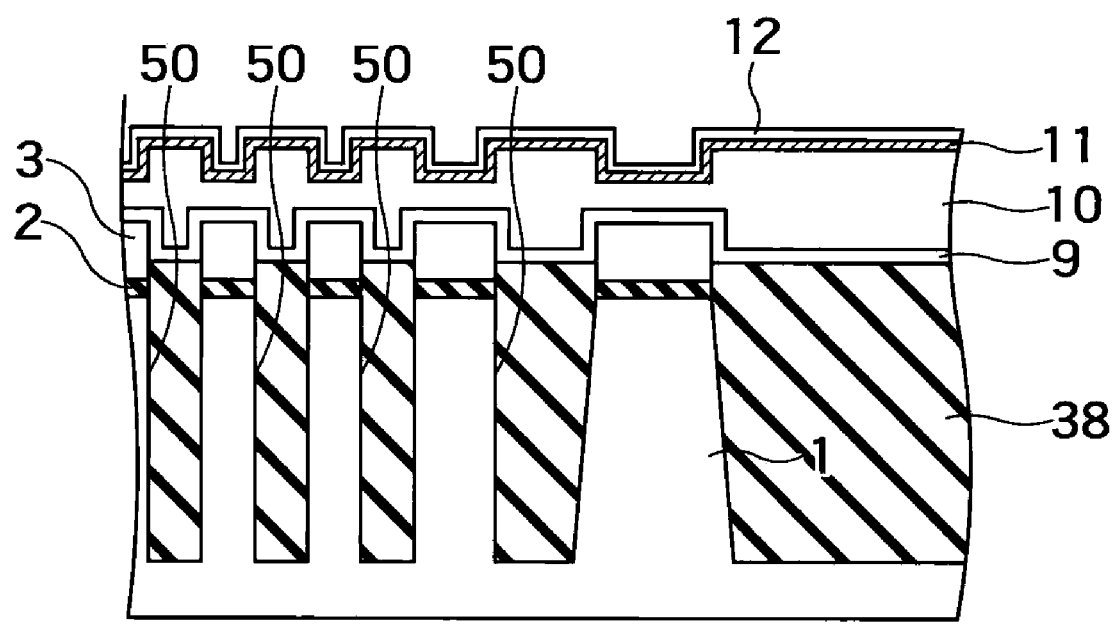
FIG. 9 is a schematic process sectional view showing a manufacturing method of the semiconductor device according to the first embodiment, the fourth embodiment and the fifth embodiment of the present invention, and is continuous from FIG. 8.
Figure 10:
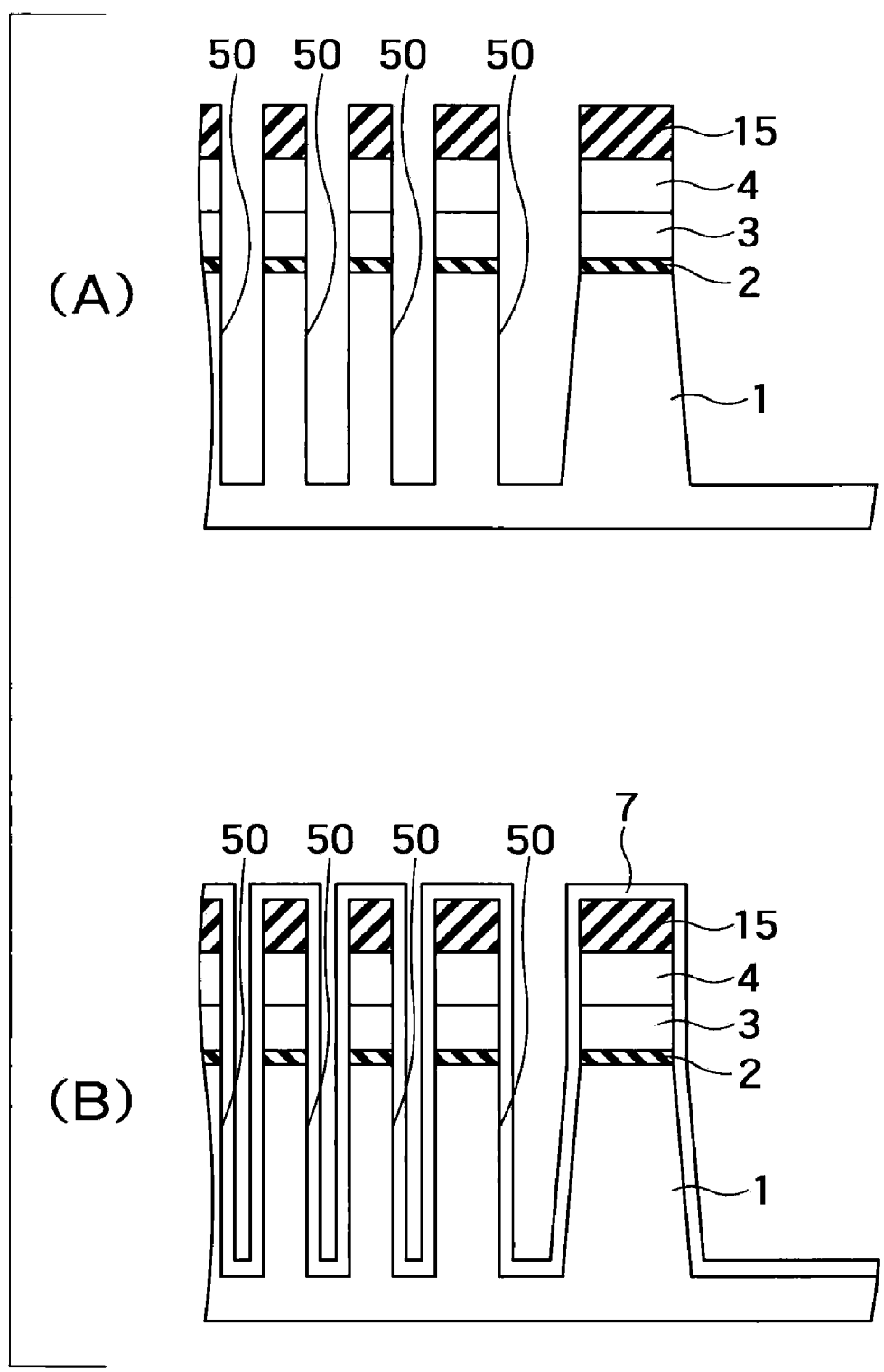
FIG. 10 is a schematic process sectional view showing a manufacturing method of the semiconductor device according to the second embodiment of the present invention.
Figure 11:
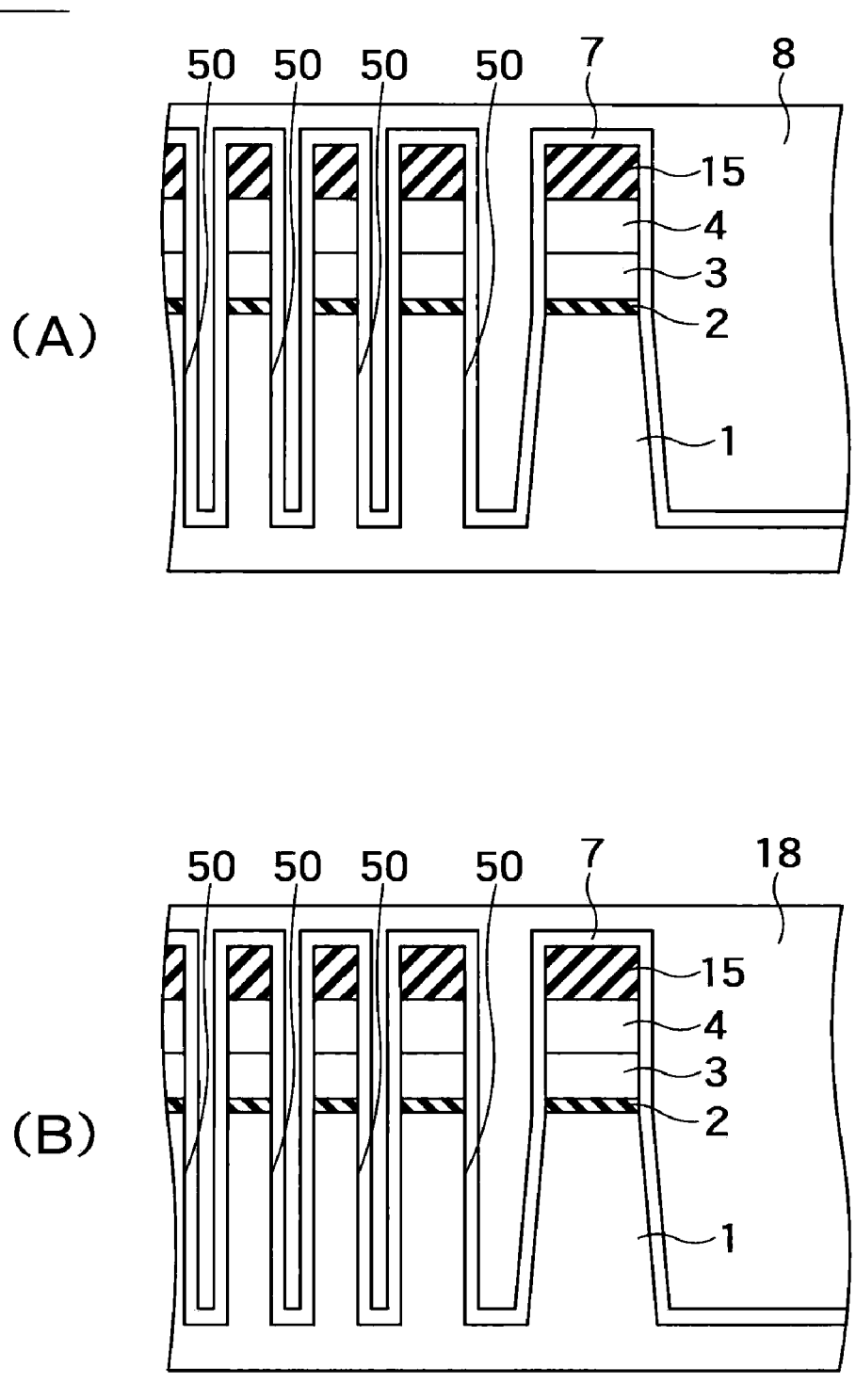
FIG. 11 is a schematic process sectional view showing a manufacturing method of the semiconductor device according to the second embodiment of the present invention, and is continuous from FIG. 10.
Figure 12:
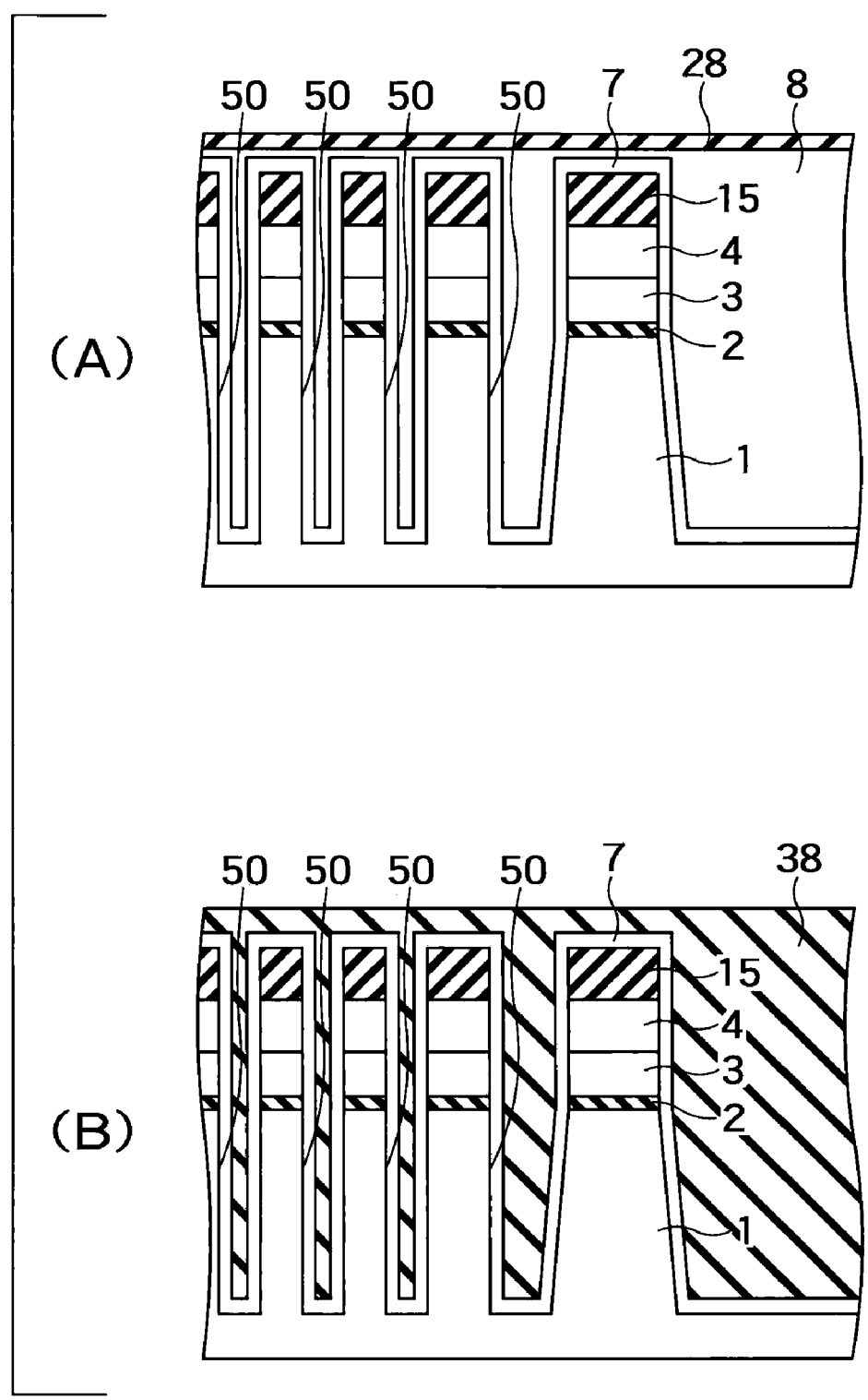
FIG. 12 is a schematic process sectional view showing a manufacturing method of the semiconductor device according to the second embodiment of the present invention, and is continuous from FIG. 11.
Figure 13:
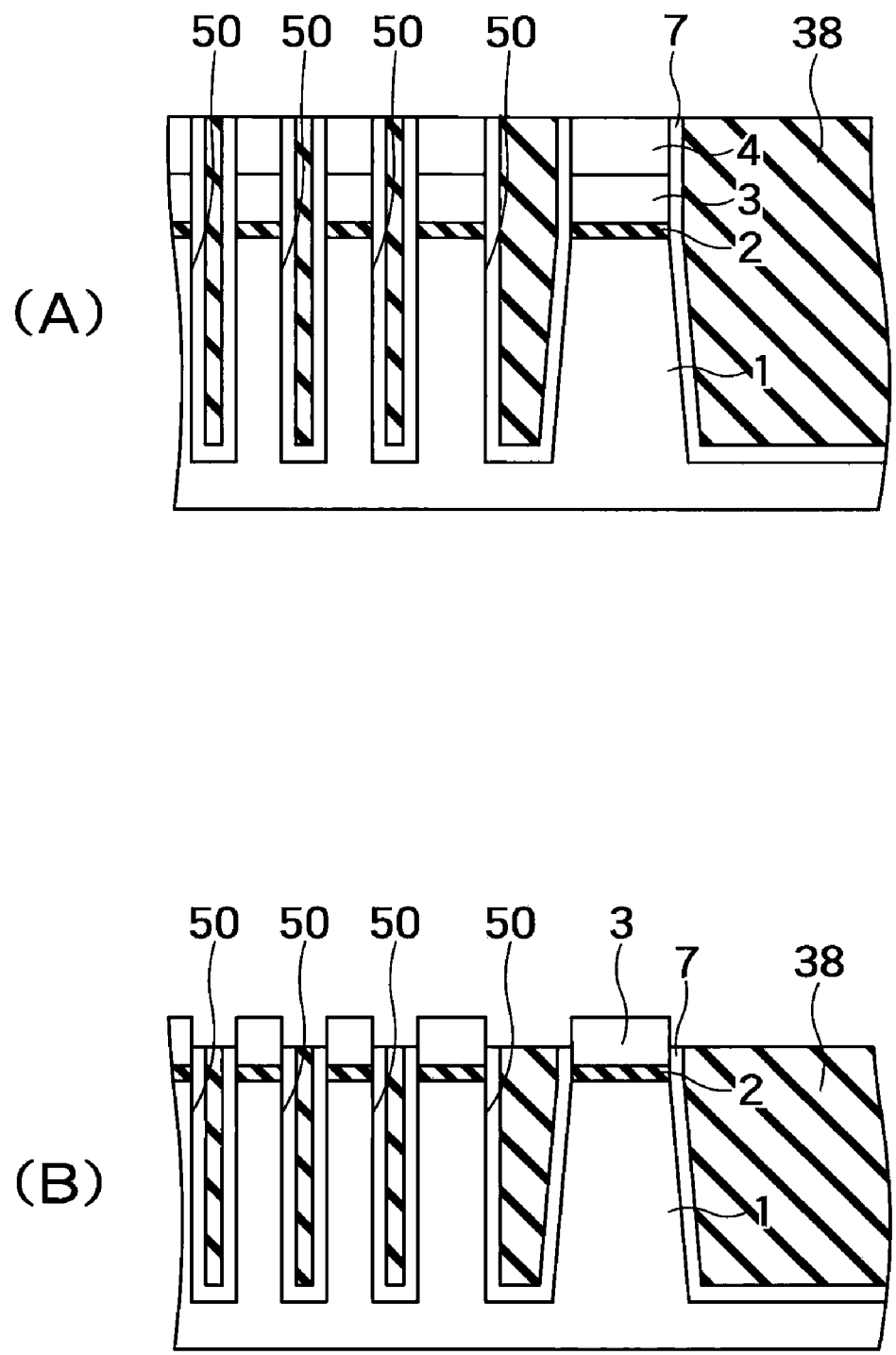
FIG. 13 is a schematic process sectional view showing a manufacturing method of the semiconductor device according to the second embodiment of the present invention, and is continuous from FIG. 12.

FIG. 2 is a schematic plan view (a part) of a semiconductor device according to a first embodiment of the present invention. To be more precise, FIG. 2 is a schematic plan view (a part) of a NAND flash memory. The schematic plan view of the semiconductor device according to second to fifth embodiments of the present invention described later also becomes as shown in FIG. 2.

In the NAND flash memory according to the first embodiment, a plurality of active areas 101 in the longitudinal direction on paper as shown in FIG. 2. In addition, the active areas 101 are arranged at regular intervals in the lateral direction on the paper and are parallel to each other. Furthermore, a plurality of gate electrodes 102 is formed so as to be perpendicular to the active areas 101 when seen as a plane. A plurality of memory cells 60 is formed in a plurality of parts where the active areas 101 and the gate electrodes 102 intersect three-dimensionally. In other words, the memory cells 60 are arranged in a NAND flash memory in a matrix form. In addition, each pair of memory cells 60 adjacent in the lateral direction on the paper is arranged with an STI (Shallow Trench Isolation) 103 between. Each of a plurality of STIs 103 is formed of a trench (element isolation trench) and an insulation film (coated silicon oxide film) which occupies the inside of the trench.

FIGS. 3 to 9 are schematic process sectional views showing a manufacturing method of the semiconductor device according to the first embodiment of the present invention. These views correspond to a section obtained by cutting along a line A-A' shown in FIG. 2. Incidentally, schematic process sectional views for a manufacturing method of the semiconductor device according to fourth and fifth embodiments of the present invention which will be described later are also represented by FIGS. 3 to 9 in the same way.

Hereafter, the manufacturing method for the semiconductor device according to the first embodiment of the present invention will be described with reference to FIGS. 3 to 9.

A gate insulation film (SiON film) 2 having a thickness of 8 nm is formed on a semiconductor substrate (silicon substrate) 1. A floating gate film (P-doped polycrystalline silicon film) 3 having a thickness of 80 nm is formed on the gate insulation film 2. A CMP stopper film (SiN film) 4 for protecting the gate insulation film 2 and the floating gate film 3 from chemical mechanical polishing (CMP) is formed on the floating gate film 3 so as to have a thickness of 70 nm. Then, over the whole surface of the semiconductor substrate 1, a mask material film (silicon oxide) 5 serving as a mask for reactive ion etching (RIE) is formed so as to cover the CMP stopper film 4 by using the chemical deposition (CMP) method. In addition, a photoresist film material 6 is applied over the whole surface of the semiconductor substrate 1 so as to cover the mask material film 5 by using the spin coating method. As a result, a photoresist film 16 is formed (see FIG. 3(A)).

Then, a desired pattern is formed in the photoresist film 16 by using the lithography technique, and a photoresist pattern 26 is formed (see FIG. 3(B)).

A pattern is formed in the mask material film 5 by using the photoresist pattern 26 having the pattern formed therein as a mask and using the RIE method. As a result, the mask material film 5 becomes a hard mask 15 (see FIG. 4(A)).

The photoresist pattern 26 is removed by usher processing and etching using a mixed solution of sulfuric acid and hydrogen peroxide water (see FIG. 4(B)).

Then, the CMP stopper film 4, the floating gate film 3 and the gate insulation film 2 are successively etched by using the hard mask 15 as a mask and using the RIE method. In addition, the semiconductor substrate 1 is etched until the etching depth becomes 220 nm as compared with the thickness of the semiconductor substrate 1. As a result, a plurality of trenches (element isolation trenches) 50 extending from the CMP stopper film 4 to the semiconductor substrate 1 are formed.

For example, the trench 50 formed between one pair of adjacent memory cells 60 has a width of 30 nm, and each of the trenches in a peripheral circuit in which a plurality of control transistors are arranged has a width of at least 100 nm (see FIG. 5(A)).

Then, a silicon compound solution 8 is applied over the whole semiconductor substrate 1 having the trenches 50 formed therein.

To be more precise, the silicon compound is, for example, polysilazane (polyperhydrosilazane) [—(SiH$_2$NH)n-], hydrogen silsesquioxane (HSQ) [—(HSiO$_{3/2}$)n-], or the like, and it is a silicon compound which is finally oxidized to become silicon oxide (coated silicon oxide). In addition, the silicon compound solution 8 is obtained by dissolving such a silicon compound in an organic solvent such as dibutyl ether or xylene.

Here, a solution obtained by dissolving polyperhydrosilazane having an average molecular weight in the range of 2,000 to 6,000 in dibutyl ether which is an organic solvent is used as the silicon compound solution 8. Therefore, it is supposed in the ensuing description that the polysilazane solution is used as the silicon compound solution 8.

The polysilazane solution 8 is applied so as to cover the whole surface of the semiconductor substrate 1 and occupy the whole trenches 50. By doing so, the polysilazane solution 8 having a thickness in the range of approximately 400 to 600 nm with reference to the top surface of the hard mask 15 and taking the shape of a film is formed over the semiconductor substrate 1 (see FIG. 5(B)).

Subsequently, pre-baking (heating processing) is conducted on the polysilazane solution 8 by using a hot plate under the condition of 150° C. and three minutes. As a result, dibutyl ether (solvent) is evaporated from the polysilazane solution 8, which exists as a film over the semiconductor substrate 1 and in the trenches 50, and a polysilazane film (silicon compound film) 18 is formed over the semiconductor substrate 1 and in the trenches 50. In this stage, the polysilazane film 18 contains a very small amount of the organic solvent, and its composition is close to a composition of the SiN film having a low crystalline density (see FIG. 6(A)).

Then, reforming (the first oxidation processing) is conducted on the polysilazane film 18 by exposing the polysilazane film 18 to an ozone atmosphere at a temperature (first temperature) which is lower than a temperature (second temperature) of ensuing high temperature oxidation processing (second oxidation processing), to be more precise, at a temperature of 300° C. or less and oxidizing the surface of the polysilazane film 18. In other words, the surface of the polysilazane film 18 is formed as a volatile matter emission preventing layer (silicon oxide film) 28 through which an oxidizing agent such as oxygen, ozone, or water and impurities such as nitrogen or hydrogen can pass and a volatile matter containing silicon atoms cannot pass. To be more precise, a part of the polysilazane film 18 located at depths in the range of approximately 40 to 50 nm from the surface of the polysilazane film 18 is oxidized and reformed to form the volatile matter emission preventing layer (silicon oxide film) 28 (see FIG. 6(B)).

This reforming (the first oxidation processing) is conducted by, for example, irradiating the polysilazane film 18 with light from excimer UV lamp in the air at the room temperature for several minutes. By doing so, oxygen contained in the air by approximately 20% is changed to ozone by the UV light. This ozone functions as the oxidizing agent and conducts reforming of oxidizing the surface of the polysilazane film 18. In addition, the surface of the polysilazane film 18 can be oxidized by using an alternative method, for example, by heating the whole semiconductor substrate 1 on the hot plate at a temperature of 300° C. or less for ten minutes to one hour while exposing the whole semiconductor substrate 1 to an ozone atmosphere (with an ozone concentration of at least 200 g/m$^3$).

Then, in order to oxidize up to the inside of the polysilazane film 18 and form a coated silicon oxide film (insulation film) 38 integrated with the volatile matter emission preventing layer, high temperature oxidation processing (the second oxidation processing) is conducted on the polysilazane film 18. For example, heating in the range of 300 to 1,000° C. is conducted in an atmosphere such as H$_2$O, O$_2$ or N$_2$ as the high temperature oxidation processing. In an alternative method, for example, heat treatment is conducted at 500° C. in a steam (H$_2$O) atmosphere for five minutes. Incidentally, conditions such as the temperature of the high temperature oxidation processing depend upon desired performance of the element to be fabricated. By doing so, the coated silicon oxide film 38 is formed (see FIG. 7(A)).

Then, ozone oxidation processing (the third oxidation processing) is conducted to expose the coated silicon oxide film 38 to an ozone atmosphere at a temperature (third temperature) which is lower than a temperature of ensuing annealing (heating processing), to be more precise, at a temperature of 300° or less. As a result, an unoxidized part in the coated silicon oxide film 38 is oxidized without making the bond structure of the coated silicon oxide film 38 firm as described earlier. To be more precise, hydrogen and nitrogen remaining in the coated silicon oxide film 38 are removed and replaced by oxygen without making the bond structure of the coated silicon oxide film 38 firm.

In this process as well, a method similar to the method used in forming the volatile matter emission preventing layer 28 can be used. In other words, in the air at the room temperature, the method for irradiating the coated silicon oxide film 38 with UV light from an excimer UV lamp for approximately several minutes can be used. Alternatively, the whole semiconductor substrate 1 may be heated on the hot plate at 300° C. or less for a time period in the range of ten minutes to one hour while exposing the whole semiconductor substrate 1 to an ozone atmosphere (with an ozone concentration of at least 200 g/m$^3$).

Then, anneal processing (heating processing) is conducted on the coated silicon oxide film 38 in a nitrogen atmosphere at 850° C. for 30 minutes. By doing so, the coated silicon oxide film 38 embedded in trenches 50 has a firm bond structure.

Then, planarization processing is conducted to planarize the coated silicon oxide film 38 by using the CMP stopper film 4 and the CMP method. At this time, extra coated silicon oxide film 38 on the surface of the semiconductor substrate 1, i.e., a part of the coated silicon oxide film 38 which is not embedded in the trenches 50 is removed by the planarization using the CMP method. At this time, the hard mask 15 is also removed simultaneously (see FIG. 7(B)).

In addition, the coated silicon oxide film 38 embedded in the trenches 50 is etched (etched back) by 120 nm in the thickness direction of the semiconductor substrate 1 by using the RIE method. By doing so, the top surface of the coated silicon oxide film 38 embedded in the trenches 50 is located in a middle position of the thickness of the floating gate film 3 of each memory cell 60 disposed on both sides of each trench 50 so as to have the trench 50 between (see FIG. 8(A)).

Then, the CMP stopper film 4 is removed by using phosphoric acid heated to 150° C. (see FIG. 8(B)).

Then, an ONO (silicon oxide film—silicon nitride film—silicon oxide film) film 9 which becomes an inter-electrode insulation film (IPD) is formed as a single layer so as to cover the top surface of the coated silicon oxide film 38 and the top surface and parts of side walls of the floating gate film 3 in the memory cell 50. Then, a control gate electrode film (P-doped polycrystal Si film) 10 is formed on the ONO film 9. A WSi film 11 is formed on the control gate electrode film 10. A SiN film 12 is formed on the WSi film 11. In addition, the SiN film 12, the WSi film 11, the control gate electrode film 10, the ONO film 9 and the floating gate film 3 are successively processed to have a desired shape by using the known lithography technique and the RIE method (see FIG. 9).

Thereafter, a process for forming an interlayer insulation film (PMD) and interconnections and other processes are executed. Finally, a NAND flash memory is completed.

As a modification of the present embodiment, warm water processing can also be added to improve electrical characteristics of the coated silicon oxide film. Hereafter, details thereof will be described.

The polysilazane film 18 is formed by coating the polysilazane solution 8 to the semiconductor substrate 1 and conducting pre-baking (heating processing) on the polysilazane solution 8. In addition, the volatile matter emission preventing layer 28 is formed by exposing the polysilazane film 18 to an ozone atmosphere of 300° C. or less (the first oxidation processing). Then, warm water processing is executed on the polysilazane film 18 (details such as conditions will be described later). Water is made to penetrate into the polysilazane film 18 via the volatile matter emission preventing layer 28 by the warm water processing. Then, high temperature oxidation processing (the second oxidation processing) is conducted at a temperature in the range of 300 to 1,000° C. under the presence of an oxidizing agent to form the coated silicon oxide film 38. In addition, the coated silicon oxide film 38 is exposed to an ozone atmosphere of 300° C. or less (the third oxidation processing) in the same way as the embodiment described earlier, and then anneal processing (heating processing) is conducted on the coated silicon oxide film 38 in a N$_2$ atmosphere. Ensuing processes are the same as those in the embodiment described earlier.

To be more precise, this warm water processing is conducted by immersing the polysilazane film 18 in pure water kept at a temperature in the range of 50° C. to 70° C. for several minutes to approximately one hour.

In addition, the oxidation processing (the second oxidation processing) in the range of 300° C. to 1,000° C. under the presence of the oxidizing agent may be conducted a plurality of times as another modification of the present embodiment. In addition, if oxidation processing is thus conducted a plurality of times, ozone processing (the third oxidation processing) of exposing the coated silicon oxide film 38 to an ozone atmosphere of 300° C. or less may be conducted a plurality of times in the intervals of oxidation processing.

According to the first embodiment of the present invention, it is possible to obtain an insulation film of coated silicon oxide having few defects and a good quality by preventing contraction of the coated silicon oxide film and suppressing the generation of the film stress in the coated silicon oxide film as heretofore described.

Second Embodiment

According to a second embodiment, an impurity diffusion preventing film (silicon oxide film) 7 is formed after the trenches (element isolation trenches) 50 are formed and before the polysilazane solution 8 is applied to the whole surface of the semiconductor substrate 1. Since the impurity diffusion preventing film 7 is formed so as to cover side walls of each memory cell 60 and side walls of each trench 50, it is possible to obtain an effect that a very small amount of impurities contained in the coated silicon oxide film 38 are prevented from the coated silicon oxide film 38 to the memory cells 60 located on both sides of the coated silicon oxide film 38 and in addition adhesion force between the coated silicon oxide film 38 and the side walls of the trench 50 is improved resulting in an increased mechanical strength of the NAND flash memory.

As described earlier, a schematic plan view of the semiconductor device according to the second embodiment is shown in FIG. 2. Description of FIG. 2 will not be given here.

FIGS. 10 to 14 are schematic process sectional views showing a manufacturing method of the semiconductor device according to the second embodiment of the present invention. These views correspond to a section obtained by cutting the semiconductor device according to the embodiment of the present invention along a line A-A' shown in FIG. 2.

Hereafter, the second embodiment will be described with reference to FIGS. 10 to 14.

A gate insulation film 2 is formed on a semiconductor substrate 1. A floating gate film 3, a CMP stopper film 4, a mask material film 5, and a photoresist film 16 are formed successively over the semiconductor substrate 1 according to a method similar to that in the first embodiment. Then, a desired pattern is formed in the photoresist film 16 as a photoresist pattern 26. In addition, a pattern is formed in the mask material film 5 by using the photoresist pattern 26 as a mask. As a result, a hard mask 15 is formed. Then, the photoresist pattern 26 is removed. Then, the CMP stopper film 4, the floating gate film 3, the gate insulation film 2 and the semiconductor substrate 1 are successively etched by using the hard mask 15 as a mask and using the RIE method. As a result, a plurality of trenches (element isolation trenches) 50 is formed in the semiconductor substrate 1 (see FIG. 10(A)).

Then, the impurity diffusion preventing film 7 is formed. A layer of silicon oxide having a thickness of 10 nm is formed so as to cover the whole semiconductor substrate 1, to be more precise, so as to cover the top surface and the side faces of the hard mask 15, the side faces of the CMP stopper film 4, the side faces of the floating gate film 3, the side faces of the gate insulation film 2, and the side walls and the bottom part of the trench 50, by using silane gas (dichlorosilane or monosilane) and $N_2O$ as raw materials and using the CVD method (see FIG. 10(B)).

Then, the polysilazane solution (silicon compound solution) 8 is applied according to the same method as that of the first embodiment. At this time, the top surface of the semiconductor substrate 1 is covered by the polysilazane solution 8, and insides of the trenches 50 are filled with the polysilazane solution 8 (see FIG. 11(A)).

Then, a polysilazane film (silicon compound film) 18 is formed according to a method similar to that of the first embodiment as shown in FIG. 11(B). In addition, a volatile matter emission preventing layer 28 is formed as shown in FIG. 12(A) (first oxidation processing). Then, a coated silicon oxide film 38 is formed as shown in FIG. 12(B) (second oxidation processing).

Figure 14:
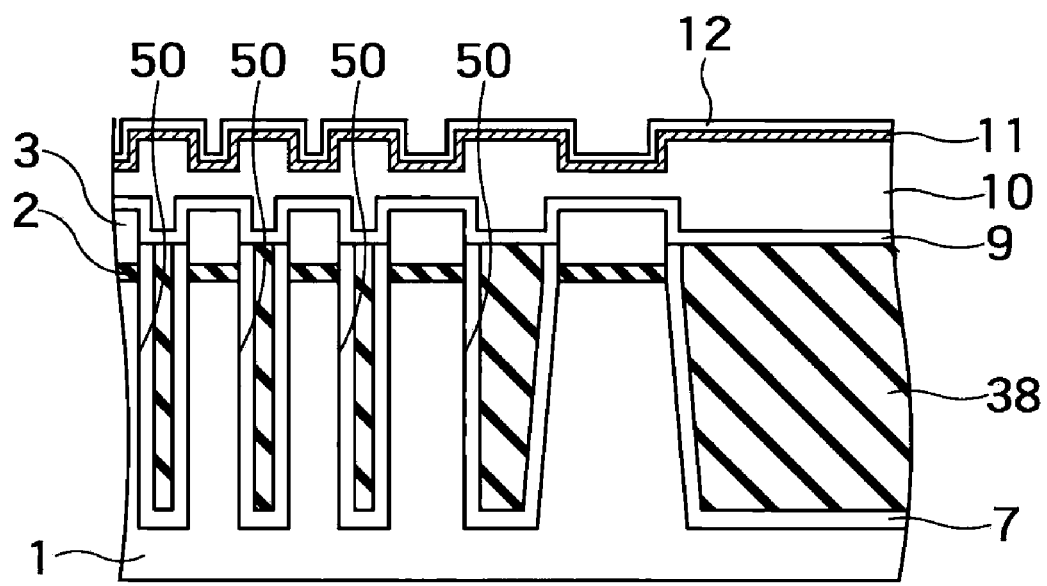
FIG. 14 is a schematic process sectional view showing a manufacturing method of the semiconductor device according to the second embodiment of the present invention, and is continuous from FIG. 13.

Then, processes shown in FIGS. 13(A), 13(B) and 14 are executed by using the same method as that in the first embodiment. Finally, a NAND flash memory is completed.

According to the second embodiment of the present invention, it is possible to obtain an insulation film of coated silicon oxide having few defects and a good quality by preventing contraction of the coated silicon oxide film and suppressing the generation of the film stress in the coated silicon oxide film in the same way as the first embodiment as heretofore described. In addition, it is possible to prevent a very small amount of impurities contained in the coated silicon oxide film 38 from spreading to films included in the memory cell 60.

Third Embodiment

In the first embodiment described earlier, the reforming (the first oxidation processing) for forming the volatile matter emission preventing layer (the silicon oxide film) 28 is conducted after the polysilazane solution (the silicon compound solution) 8 is pre-baked (subjected to the heating processing). In a third embodiment, the volatile matter emission preventing layer 28 is formed before pre-baking the polysilazane solution 8.

Even if the order of processes for forming the volatile matter emission preventing layer 28 is thus changed, the same effects as those of the first embodiment can be obtained. Because the volatile matter emission preventing layer 28 formed of silicon oxide has a property of preventing a volatile matter containing silicon atoms from being emitted, passing an oxidizing agent such as oxygen and impurities such as nitrogen through it, and passing a solvent contained in the polysilazane solution 8 through it.

A semiconductor device according to the third embodiment also has the same configuration as that of the semiconductor device according to the first embodiment described earlier. As described earlier, a schematic plan view of the semiconductor device according to the third embodiment becomes the same as FIG. 2. Description of FIG. 2 will not be given here.

Figure 15:
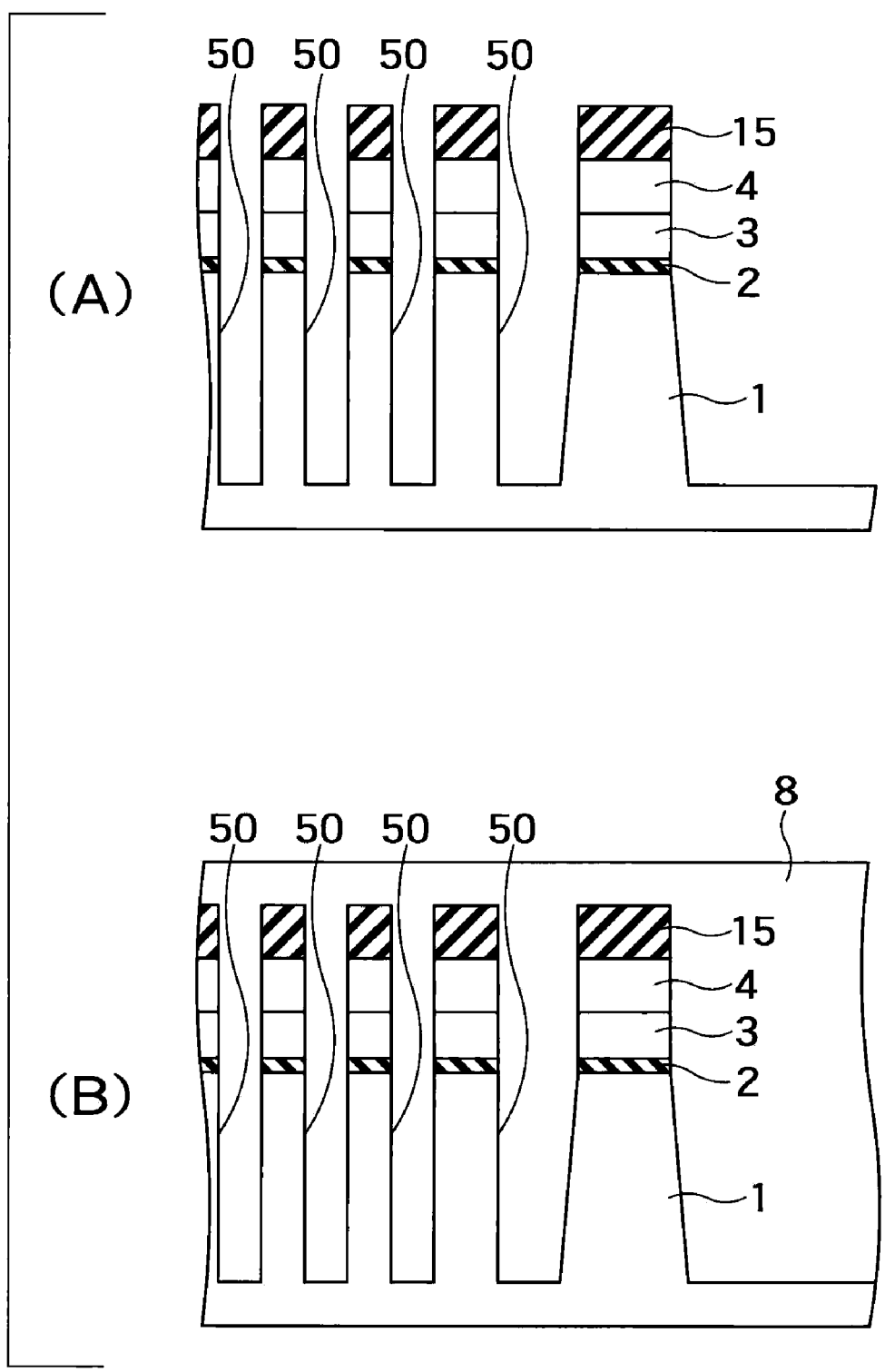
FIG. 15 is a schematic process sectional view showing a manufacturing method of the semiconductor device according to the third embodiment of the present invention.
Figure 16:
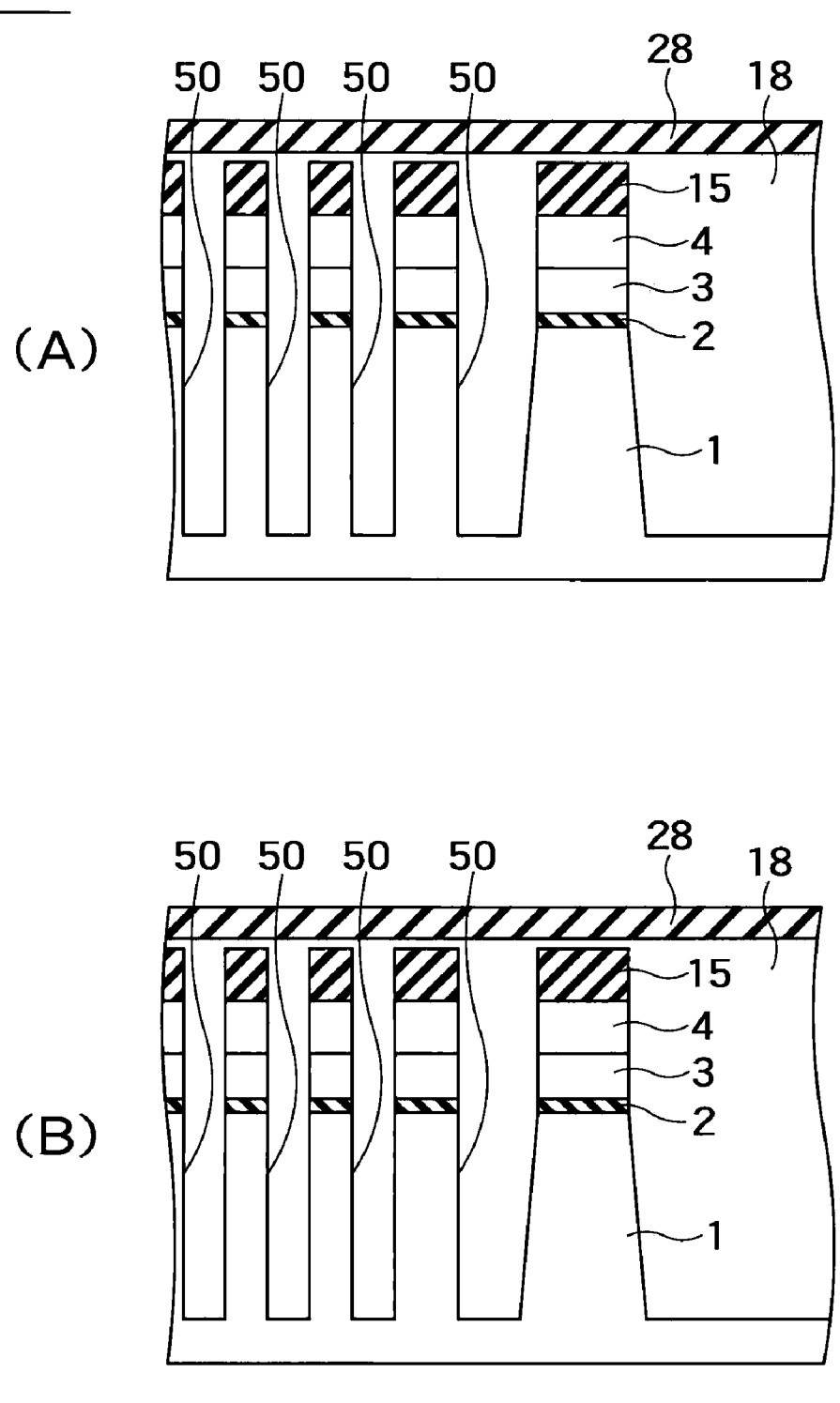
FIG. 16 is a schematic process sectional view showing a manufacturing method of the semiconductor device according to the third embodiment of the present invention, and is continuous from FIG. 15.
Figure 17:
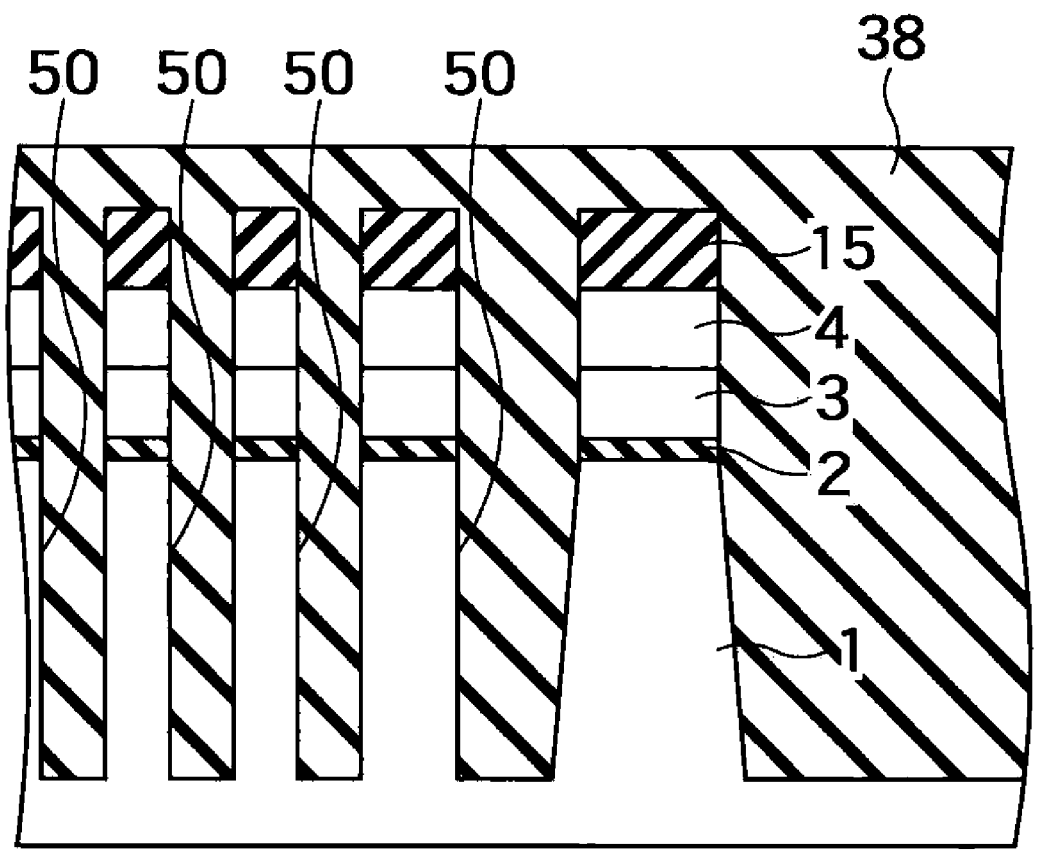
FIG. 17 is a schematic process sectional view showing a manufacturing method of the semiconductor device according to the third embodiment of the present invention, and is continuous from FIG. 16.

FIGS. 15 to 17 are schematic process sectional views showing a main manufacturing method of the semiconductor device according to the third embodiment. FIGS. 15 to 17 correspond to a section obtained by cutting the semiconductor device according to the third embodiment along a line A-A' in FIG. 2.

Hereafter, a main manufacturing method in the third embodiment will be described with reference to FIGS. 15 to 17. As for the same processes as those in the first embodiment, description will not be repeated.

A gate insulation film 2 is formed on a semiconductor substrate 1. A floating gate film 3, a CMP stopper film 4, a mask material film 5, and a photoresist film 16 are formed successively over the semiconductor substrate 1 according to a method similar to that in the first embodiment. In addition, a plurality of trenches 50 is formed in the semiconductor substrate 1 (see FIG. 15(A)).

Then, a polysilazane solution (silicon compound solution) 8 obtained by dissolving, for example, polysilazane in an organic solvent (for example, dibutyl ether or the like) is applied to the top face of the semiconductor substrate 1 and insides of the trenches (element isolation trenches) 50. By doing so, a film-shaped polysilazane solution 8 is formed on the top face of the semiconductor substrate 1 and inside the trenches 50 (see FIG. 15(B)).

Then, reforming (the first oxidation processing) for oxidizing the surface of the polysilazane solution 8 is conducted by exposing the polysilazane solution 8 to an ozone atmosphere of 300° C. or less, and a volatile matter emission preventing layer (silicon oxide) 28 is formed on the surface of the polysilazane solution 8 (see FIG. 16(A)). Incidentally, the polysilazane solution 8 may be exposed to an oxygen or steam atmosphere instead of being exposed to the ozone atmosphere.

In addition, pre-baking (heating processing) is conducted on the polysilazane solution 8 by using a hot plate under the condition of 150° C. and three minutes. As a result, an organic solvent is evaporated from the film-shaped polysilazane solution 8 located under the volatile matter emission preventing layer 28 via the volatile matter emission preventing layer 28, and a polysilazane film (silicon compound film) 18 is formed under the volatile matter emission preventing layer 28 and on the top face of the semiconductor substrate 1 and inside the trenches 50 (see FIG. 16(B)).

Then, oxidation processing (second oxidation processing) for oxidizing the polysilazane film 18 is conducted in the same way as the first embodiment. By doing so, the polysilazane film 18 is oxidized and integrated with the volatile matter emission preventing layer 28, resulting in a coated silicon oxide film 38 (see FIG. 17).

Since ensuing processes are the same as those in the first embodiment, description of them will not be repeated. In the same way as the first embodiment, the processes shown in FIGS. 7(A), 7(B), 8(A), 8(B), and 9 are executed, and finally a NAND flash memory is completed.

According to the third embodiment of the present invention, it is possible to obtain an insulation film of coated silicon oxide having few defects and a good quality by preventing contraction of the coated silicon oxide film and suppressing the generation of the film stress in the coated silicon oxide film in the same way as the first embodiment as heretofore described.

Fourth Embodiment

In the embodiments heretofore described, the volatile matter emission preventing layer (silicon oxide film) 28 is formed by using ozone oxidation as the first oxidation processing. In a fourth embodiment, the volatile matter emission preventing layer 28 is formed by using a method different from that in the embodiments heretofore described. To be more precise, the volatile matter emission preventing layer 28 of the oxide silicon is formed on the surface of the polysilazane film 18 by irradiating the polysilazane film (silicon compound film) 18 with oxygen radicals and thereby oxidizing the surface of the polysilazane film 18.

A semiconductor device according to the fourth embodiment also has the same configuration as that of the semiconductor device according to the first embodiment described earlier. As described earlier, a schematic plan view of the semiconductor device according to the fourth embodiment becomes the same as FIG. 2. Description of FIG. 2 will not be given here.

Schematic process sectional views showing a manufacturing method of the semiconductor device according to the fourth embodiment become the same as FIGS. 3 to 9.

Hereafter, the fourth embodiment will be described with reference to FIGS. 3 to 9. As for the same processes as those in the first embodiment, description will not be repeated.

A gate insulation film 2 is formed on a semiconductor substrate 1. A floating gate film 3, a CMP stopper film 4, a mask material film 5, and a photoresist film 16 are formed successively over the semiconductor substrate 1 according to a method similar to that in the first embodiment (see FIG. 3(A)). In addition, a plurality of trenches (element isolation trenches) 50 are formed in the semiconductor substrate 1 via the processes shown in FIGS. 3(B) to 4(B) (see FIG. 5(A)). Then, a polysilazane film (silicon compound film) 18 is formed on the top face of the semiconductor substrate 1 and inside the trenches 50 via the process shown in FIG. 5(B) (see FIG. 6(A)).

Then, the polysilazane film 18 is irradiated with oxygen radicals. The oxygen radicals can be generated by irradiating a mixed gas of oxygen and argon gas with a microwave. To be more precise, it is desirable to set oxygen contained in the mixed gas equal to at least 5% and more desirable to set it equal to 25%. The polysilazane film 18 is irradiated with the oxygen radicals thus generated for at least one minute to conduct reforming for oxidizing the surface of the polysilazane film 18. The volatile matter emission preventing layer of silicon oxide (silicon oxide film) 28 is formed on the surface of the polysilazane film 18 by the reforming (see FIG. 6(B)).

In addition, high temperature oxidation processing (second oxidation processing) for oxidizing the polysilazane film 18 is conducted in the same way as the embodiments heretofore described. By doing so, the polysilazane film 18 is oxidized and integrated with the volatile matter emission preventing layer 28, resulting in a coated silicon oxide film 38 (see FIG. 7(A)).

Since ensuing processes are the same as those in the first embodiment, description of them will not be repeated. In the same way as the first embodiment, the processes shown in FIGS. 7(B), 8(A) 8(B), and 9 are executed, and finally a NAND flash memory is completed.

As a modification of the fourth embodiment, a method for irradiating the polysilazane film 18 with OH radicals concurrently with the oxygen radicals can be mentioned. Oxidation of the polysilazane film 18 can be further promoted by irradiating the polysilazane film 18 with the OH radicals concurrently with the oxygen radicals. To be more precise, the OH radicals can be generated concurrently with the oxygen radicals by further mixing hydrogen gas with the mixed gas for generating the oxygen radicals and irradiating a resultant mixed gas with a microwave. The polysilazane film 18 is irradiated with the oxygen radicals and the OH radicals thus generated. Other processes are the same as those in the embodiments described earlier.

According to the fourth embodiment of the present invention, it is possible to obtain an insulation film of coated silicon oxide having few defects and a good quality by preventing contraction of the coated silicon oxide film and suppressing the generation of the film stress in the coated silicon oxide film in the same way as the other embodiments heretofore described.

Fifth Embodiment

In the embodiments heretofore described, the volatile matter emission preventing layer (silicon oxide film) 28 is formed by using the ozone oxidation or oxygen radical irradiation as the first oxidation processing. In a fifth embodiment, the volatile matter emission preventing layer 28 is formed by using a method different from that in the embodiments heretofore described. To be more precise, reforming (first oxidation processing) of oxidizing the surface of the polysilazane film 18 is conducted by implanting oxygen ions in the polysilazane film (silicon compound film) 18, and the volatile matter emission preventing layer 28 is formed. The fifth embodiment has an advantage that the thickness of the formed volatile matter emission preventing layer 28 can be controlled easily by changing implantation conditions to be used when implanting oxygen ions.

A semiconductor device according to the fifth embodiment also has the same configuration as that of the semiconductor device according to the first embodiment described earlier. A schematic plan view of the semiconductor device according to the fifth embodiment becomes the same as FIG. 2. Description of FIG. 2 will not be given here.

Schematic process sectional views showing a manufacturing method of the semiconductor device according to the fifth embodiment become the same as FIGS. 3 to 9. Hereafter, the fifth embodiment will be described with reference to FIGS. 3 to 9. As for the same processes as those in the first embodiment, description will not be repeated.

A gate insulation film 2 is formed on a semiconductor substrate 1. A floating gate film 3, a CMP stopper film 4, a mask material film 5, and a photoresist film 16 are formed successively over the semiconductor substrate 1 according to a method similar to that in the first embodiment (see FIG. 3(A)). In addition, a plurality of trenches (element isolation trenches) 50 are formed in the semiconductor substrate 1 via the processes shown in FIGS. 3(B) to 4(B) (see FIG. 5(A)). Then, a polysilazane film (silicon compound film) 18 is formed on the top face of the semiconductor substrate 1 and inside the trenches 50 via the process shown in FIG. 5(B) (see FIG. 6(A)).

Then, oxygen ions are implanted in the polysilazane film 18. The film thickness of the volatile matter emission preventing layer 28 formed on the surface of the polysilazane film 18 can be controlled according to the oxygen ion implantation condition at this time. For example, oxygen ions are implanted in the polysilazane film 18 under the condition that the oxygen ion implantation energy is 10 keV and the oxygen ion implantation quantity is $1.0 \times 10^{14}/cm^2$. By doing so, reforming (first oxidation processing) of oxidizing the surface of the polysilazane film 18 is conducted and a volatile matter emission preventing layer (silicon oxide film) 28 of silicon oxide is formed on the surface of the polysilazane film 18 (see FIG. 6(B)).

Then, high temperature oxidation processing (second oxidation processing) is conducted to oxidize the whole polysilazane film 18 in the same way as the embodiments heretofore described. By conducting this processing, the polysilazane film 18 is oxidized and integrated with the volatile matter preventing layer 28, resulting in a coated silicon oxide film 38 (see FIG. 7(A)).

Since ensuing processes are the same as those in the first embodiment, description of them will not be repeated. The processes shown in FIGS. 7(B), 8(A), 8(B), and 9 are executed, and finally a NAND flash memory is completed.

According to the fifth embodiment of the present invention, it is possible to obtain an insulation film of coated silicon oxide having few defects and a good quality by preventing contraction of the coated silicon oxide film and suppressing the generation of the film stress in the coated silicon oxide film in the same way as the other embodiments heretofore described. In addition, the thickness of the formed volatile matter emission preventing layer 28 can be controlled easily by changing the implantation condition used when implanting oxygen ions.

Sixth Embodiment

In the conventional art already described, annealing is conducted in an atmosphere of inert gas such as nitrogen in order to transform the polysilazane film to a good quality silicon oxide film, for example, in order to make a polysilazane film oxidized by steam oxidation minuter.

As already described, film contraction occurs in the polysilazane film at the time of this annealing. Therefore, stress is applied to the foundation, and it becomes a cause of generation of crystal defects in the semiconductor substrate.

If the surface of the applied polysilazane film is oxidized by, for example, ozone ($O_3$) generated by illuminance of UV light from a UV lamp, then the film contraction of the polysilazane film can be suppressed at the time of later annealing.

However, the applied polysilazane film is hardened by heat which is generated by illumination of UV light from the UV lamp.

The present inventors have found that even if the later steam oxidation and annealing are conducted in the case where hardening of the polysilazane film is caused the polysilazane film is not oxidized sufficiently and a silicon oxide film having desired characteristics cannot be formed.

Therefore, the present inventors propose a method for forming a silicon oxide film which improves the film quality of the silicon oxide film while suppressing occurrence of crystal defects in the semiconductor substrate.

Hereafter, a sixth embodiment according to the present invention will be described with reference to drawings. Hereafter, the case where a polysilazane solution is used as a solution containing silicon will be described as an example. In this case, a silicon oxide film is formed by conducting oxidation processing on a polysilazane film (a film containing silicon or a silicon compound film) obtained by volatilizing a solvent in the solution.

As the solution containing silicon, however, a solution such as a polysilane solution or a hydrosiloxane solution may be used. In this case, a silicon oxide film is formed by conducting oxidation processing on a polysilane film or a hydrosiloxane film, which is a film containing silicon (a silicon compound film) obtained by volatilizing the solvent in the solution.

In the sixth embodiment, especially an example of the case where a silicon oxide film is embedded in STI trenches formed on the semiconductor substrate will be described.

Figure 20:
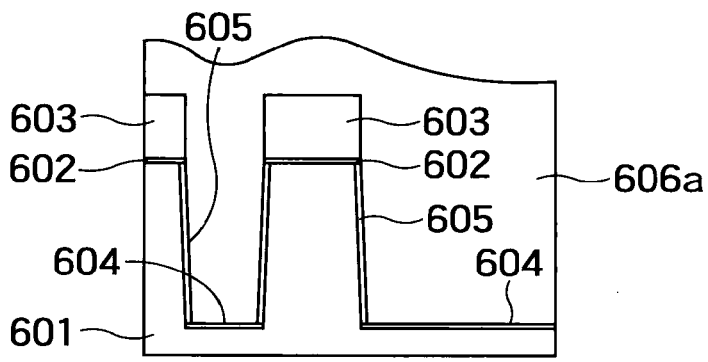
FIG. 20 is a sectional view in respective process of a silicon oxide film forming method according to the sixth embodiment of the present invention, and is continuous from FIG. 19.
Figure 21:
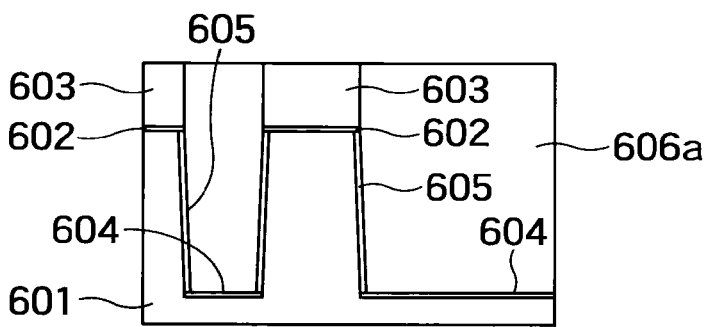
FIG. 21 is a sectional view in respective process of a silicon oxide film forming method according to the sixth embodiment of the present invention, and is continuous from FIG. 20.
Figure 22:
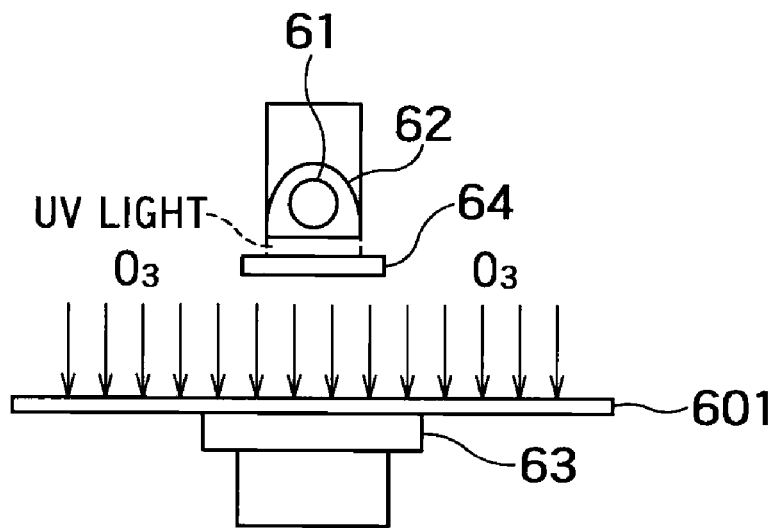
FIG. 22 is a diagram showing an example of an apparatus which generates ozone by using UV light and oxidizes the surface of the polysilazane film on the semiconductor substrate.
Figure 23:
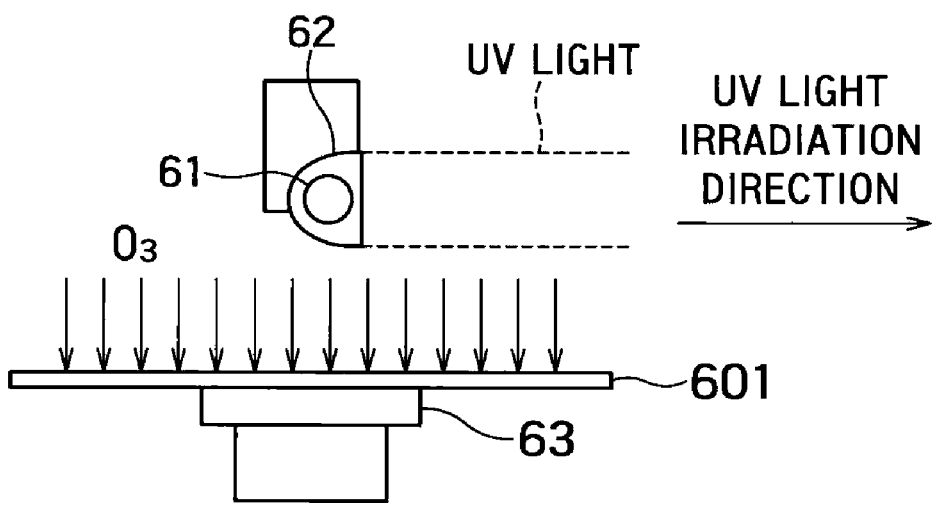
FIG. 23 is a diagram showing another example of an apparatus which generates ozone by using UV light and oxidizes the surface of the polysilazane film on the semiconductor substrate.

FIGS. 18 to 21 are sectional views in respective processes of a silicon oxide film forming method according to the sixth embodiment of the present invention. FIG. 22 is a diagram showing an example of an apparatus which generates ozone by using UV light and oxidizes the surface of the polysilazane film on the semiconductor substrate. FIG. 23 is a diagram showing another example of an apparatus which generates ozone by using UV light and oxidizes the surface of the polysilazane film on the semiconductor substrate.

First, a thermal oxidized film 602 having a thickness of, for example, approximately 5 nm is formed on a semiconductor substrate 601 by using the thermal oxidation method. And a silicon nitride film 603 which becomes a polishing stopper film for later CMP (Chemical Mechanical Polishing) is formed on the thermal oxidized film 602 so as to have a thickness of, for example, approximately 150 nm.

Then, a mask film (not illustrated) such as a silicon oxide film which becomes a hard mask for RIE (Reactive Ion Etching) is formed over the whole surface of the semiconductor substrate 601 by using the CVD (Chemical Vapor Deposition) method. In addition, a photoresist film (not illustrated) is applied onto this mask film.

Then, the photoresist film is processed by using the ordinary lithography technique. And the mask film is processed by using the photoresist film as a mask and using RIE. Then, the photoresist film is removed by etching using usher and a mixed solution of sulfuric acid and hydrogen peroxide water.

Then, the silicon nitride film 603, the thermal oxidized film 602 and the semiconductor substrate 601 are successively processed by using the mask film as a hard mask and using RIE. As a result, trenches having an etching depth of 300 nm are formed in the semiconductor substrate 601 by using the spin coating method.

Then, the mask film is removed selectively by using, for example, hydrogen fluoride vapor. Subsequently, the inside face of the trenches is subjected to thermal oxidation to form a thermal oxidized film 604 having a thickness of 4 nm.

Figure 18:
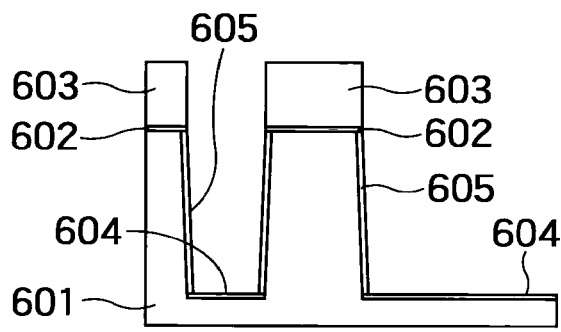
FIG. 18 is a sectional view in respective process of a silicon oxide film forming method according to the sixth embodiment of the present invention.

As a result, STI trenches 605 for STI are formed in the semiconductor substrate 601 (FIG. 18).

Figure 19:
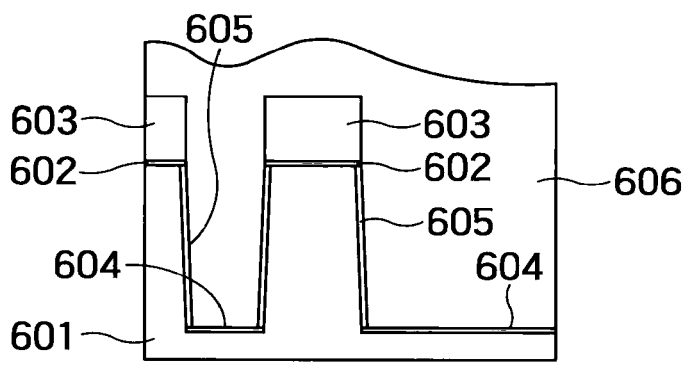
FIG. 19 is a sectional view in respective process of a silicon oxide film forming method according to the sixth embodiment of the present invention, and is continuous from FIG. 18.

Then, a polysilazane film 606 is formed over the whole surface of the semiconductor substrate 601 having the STI trenches formed therein (FIG. 19). To be more precise, the polysilazane film 606 is formed as described hereafter.

For example, a perhydrosilazane polymer [$(SiH_2NH)_n$] is scattered in xylene, dibutyl ether, or the like to generate a perhydrosilazane polymer solution (polysilazane solution). This perhydrosilazane polymer solution (solution containing silicon) is applied onto the surface of the semiconductor substrate 601.

The perhydrosilazane polymer is embedded inside the trenches having a high aspect ratio without generating voids (unfilled) and seams (seam-like unfilled parts) by coating the perhydrosilazane polymer solution as described above.

A solvent in the applied perhydrosilazane polymer solution is volatilized by heating processing to form a polysilazane film (a film containing silicon) from the perhydrosilazane polymer on the surface of the semiconductor substrate 601.

In other words, for example, the semiconductor substrate having the applied film formed therein is heated to, for example, 150° C. on a hot plate, and baked for several minutes. As a result, the solvent in the perhydrosilazane polymer solution is volatilized.

As heretofore described, the polysilazane film 606 is formed over the semiconductor substrate 601 (FIG. 19).

Then, an apparatus shown in FIG. 22 brings the polysilazane film 606 formed over the semiconductor substrate 601 which is supported by a support part 63 into a state in which the polysilazane film 606 is prevented from being hardened by heat from a UV lamp 61. In this state, the UV lamp 61 is made to emit UV light in an atmosphere containing oxygen ($O_2$). As a result, ozone ($O_3$) is generated in the atmosphere. The surface of the polysilazane film 606 is oxidized by the generated ozone.

In the present embodiment, a screening plate 64 is disposed between the UV lamp 61 and the surface of the semiconductor substrate 601 having the polysilazane film 606 formed thereon to screen heat generated when the UV lamp 61 emits UV light as shown in FIG. 22. As a result, the heat from the UV lamp 61 is screened by the screening plate 64 to prevent the polysilazane film 606 from being hardened by heat from the UV lamp 61. The UV lamp 61 includes a cover 62 to determine the irradiation direction of the UV light, and irradiation of the UV light is directed toward the screening plate 64.

In the case where the UV lamp 61 emits UV light, the irradiation direction of the UV lamp may be made parallel to the surface of the semiconductor substrate 601 by the cover 62 as shown in FIG. 23. As a result, heat from the UV lamp 61 is screened by the cover 62, and the polysilazane film 606 can be prevented from being hardened by heat from the UV lamp 61.

The UV lamp 61 may be disposed at a predetermined distance from the semiconductor substrate 601 so as to prevent the polysilazane film 606 from being hardened by heat from the UV lamp 61.

The atmosphere containing oxygen needs only to contain at least oxygen ($O_2$). For example, the atmosphere containing oxygen may be the air or an atmosphere which is higher than the air in oxygen concentration.

The ozone generated by emission of UV light from the UV lamp 61 may be made to flow as far as the vicinity of the surface of the polysilazane film 606 by, for example, reducing the pressure in the vicinity of the semiconductor substrate 601. As a result, the surface of the polysilazane film 606 can be oxidized more efficiently.

Then, impurities in the polysilazane film are removed by, for example, steam-oxidizing the polysilazane film 606 with a diffusion furnace.

Then, the polysilazane film 606 is annealed with the object of making the film more minute. The annealing is conducted in dry oxygen for 30 minutes under the condition that the heating temperature is 900° C. As a result, the polysilazane film 606 is changed (reformed) to a silicon oxide film 606a (FIG. 20).

Then, the silicon oxide film 606a is polished by using the CMP technique and using the silicon nitride film 603 as a stopper. As a result, the silicon nitride film 606a is made to remain only within the STI trenches 605 (FIG. 21).

Thereafter, processes such as a process for removing the silicon nitride film 603 in hot phosphoric acid and forming elements like transistors follow.

Owing to the processes heretofore described, the film quality of the silicon oxide film formed in the STI trenches can be improved while suppressing occurrence of crystal defects in the semiconductor substrate.

According to the silicon oxide film forming method in the present embodiment, the film quality of the silicon oxide film can be improved while suppressing occurrence of crystal defects in the semiconductor substrate.

In the sixth embodiment, the case where the silicon oxide film embedded in the STI trenches is formed has been described. However, the present invention may also be applied to the case where the silicon oxide film is formed as an interlayer insulation film.

In the sixth embodiment, an example in which the polysilazane film is used singly as the embedded film has been described. However, similar operation effects can be brought about even if, for example, a silicon oxide film is formed in STI trenches by using the CVD method and then a polysilazane film is formed by using the spin coating method.

In the sixth embodiment, the case where the polysilazane solution is used as a solution containing silicon has been described. In this case, a silicon oxide film is formed by conducting oxidation processing on a polysilazane film (a film containing silicon) obtained by volatilizing the solvent in the solution.

However, a solution such as a polysilane solution or a hydrosiloxane solution may be used. In this case as well, oxidation processing is conducted on a polysilane film or a hydrosiloxane film, which is a film containing silicon obtained by volatilizing the solvent in the solution. As a result, a silicon oxide film is formed.

What is claimed is:

1. A semiconductor device manufacturing method comprising:
   forming an element isolation trench in a semiconductor substrate;
   forming a silicon compound film in insides of the element isolation trench in order to embed the element isolation trench before a first oxidation process;
   conducting the first oxidation process to reform a surface of the silicon compound film; and
   conducting a second oxidation process to form a coated silicon oxide film from the silicon compound film,
   wherein the first oxidation process at a first temperature reforms the surface of the silicon compound film to a volatile matter emission preventing layer which permits passage of an oxidizing agent and impurities and which does not permit passage of a volatile matter containing silicon atoms; and wherein the second oxidation process is conducted at a second temperature which is higher than the first temperature.

2. The semiconductor device manufacturing method according to claim 1, wherein the silicon compound film is either polysilazane (polyperhydrosilazane) or hydrogen silses quioxane (HSQ).

3. The semiconductor device manufacturing method according to claim 1, wherein the first oxidation processing is either ozone oxidation, oxygen radical irradiation, or oxygen ion implantation.

4. The semiconductor device manufacturing method according to claim 2, wherein the first oxidation processing is either ozone oxidation, oxygen radical irradiation, or oxygen ion implantation.

5. The semiconductor device manufacturing method according to claim 1, further comprising:
after the second oxidation process,
conducting a third oxidation process at a third temperature.

6. The semiconductor device manufacturing method according to claim 5, further comprising:
after the third oxidation process,
conducting heating processing at a temperature which is higher than the third temperature.

7. The semiconductor device manufacturing method according to claim 2, further comprising:
after the second oxidation process,
conducting a third oxidation process at a third temperature.

8. The semiconductor device manufacturing method according to claim 1,
wherein an impurity diffusion preventing film is formed on a surface of the element isolation trench, and the silicon compound film is formed in insides of the element isolation trench in order to embed the element isolation trench.

9. The semiconductor device manufacturing method according to claim 8, wherein the element isolation trench includes a gate insulation film and a gate electrode formed on the semiconductor substrate, and the impurity diffusion preventing film is formed on a side wall of the gate electrode.

10. The semiconductor device manufacturing method according to claim 8, wherein the impurity diffusion preventing film is formed by using a CVD method.

11. The semiconductor device manufacturing method according to claim 8, wherein the impurity diffusion preventing film is a silicon oxide film.

12. The semiconductor device manufacturing method according to claim 1, further comprising conducting a warm water processing process between the first oxidation process and the second oxidation process.

13. The semiconductor device manufacturing method according to claim 1, further comprising conducting a third oxidation process after the coated silicon oxide film is formed.

14. The semiconductor device manufacturing method according to claim 1, wherein the second oxidation process is an oxidation conducted in a steam ($H_2O$) atmosphere or an oxide atmosphere.

15. The semiconductor device manufacturing method according to claim 1, wherein the first oxidation process is an oxygen radical irradiation that irradiates oxygen radicals and OH radicals.

* * * * *